(12) United States Patent
Kobayashi et al.

(10) Patent No.: US 10,910,958 B2
(45) Date of Patent: Feb. 2, 2021

(54) CONTROL APPARATUS FOR POWER CONVERSION SYSTEM

(71) Applicant: DENSO CORPORATION, Kariya (JP)

(72) Inventors: Naoto Kobayashi, Nisshin (JP); Seiji Iyasu, Nisshin (JP); Yuichi Handa, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/699,228

(22) Filed: Nov. 29, 2019

(65) Prior Publication Data

US 2020/0169187 A1 May 28, 2020

(30) Foreign Application Priority Data

Nov. 28, 2018 (JP) .................................. 2018-222788

(51) Int. Cl.
*H02M 7/797* (2006.01)
*H02M 1/08* (2006.01)
(Continued)

(52) U.S. Cl.
CPC ...... *H02M 7/797* (2013.01); *G01R 19/16538* (2013.01); *H02M 1/08* (2013.01); *H02M 1/32* (2013.01); *H02M 2001/0009* (2013.01)

(58) Field of Classification Search
CPC ............ H02M 1/08; H02M 1/32; H02M 1/00; H02M 1/12; H02M 1/4208; H02M 1/4225; H02M 1/42; H02M 1/088; H02M 1/4233; H02M 1/4258; H02M 7/797; H02M 7/06; H02M 7/217; H02M 7/539; H02M 7/02; H02M 7/04; H02M 7/12; H02M 7/21;
(Continued)

(56) References Cited

U.S. PATENT DOCUMENTS 6,545,887 B2 * 4/2003 Smedley ................... H02J 3/38
363/89
7,847,499 B2 * 12/2010 Nakamura ........ H02M 7/53873
318/400.27
(Continued)

FOREIGN PATENT DOCUMENTS

JP 2010-104233 A 5/2010
JP 2011-130572 A 6/2011
(Continued)

*Primary Examiner* — Thienvu V Tran
*Assistant Examiner* — Nusrat Quddus
(74) *Attorney, Agent, or Firm* — Oliff PLC

(57) ABSTRACT

In a control apparatus, a voltage obtainer obtains an alternating-current voltage having a polarity across first and second alternating-current terminals. An overcurrent determiner determines whether a target current flowing through the first and second alternating-current terminals is in an overcurrent state. A controller alternately turns on a first set of first and fourth switches and a second set of second and third switches in accordance with the polarity of the alternating-current voltage. The controller changes a switching operation of at least one of the first to fourth switch being in an on state to thereby reduce the target current flowing through the first and second alternating-current terminals upon determination that the target current flowing through the first and second alternating-current terminals is in the overcurrent state.

13 Claims, 18 Drawing Sheets

(51) Int. Cl.
   *G01R 19/165* (2006.01)
   *H02M 1/32* (2007.01)
   *H02M 1/00* (2006.01)

(58) Field of Classification Search
   CPC .... H02M 7/2176; H02M 7/5387; H02M 7/44; H02M 7/48; H02M 7/537; H02M 7/5395; H02M 7/53873; H02M 7/53871; H02M 3/156; H02M 3/33584; H02M 3/33576; H02M 3/3376; H02M 3/33569; H02M 3/337; H02M 2001/0025; H02M 2001/0058; H02M 2001/0009; H02M 2001/0048; H02M 2001/007
   See application file for complete search history.

(56) References Cited

U.S. PATENT DOCUMENTS

| | | | | |
|---|---|---|---|---|
| 8,264,181 | B2* | 9/2012 | Yamakawa | H02M 7/53873 318/432 |
| 8,953,348 | B2* | 2/2015 | Sugawara | H02M 3/156 363/89 |
| 9,071,148 | B2* | 6/2015 | Hosotani | H02M 3/33507 |
| 9,123,467 | B2* | 9/2015 | Wu | B60L 53/122 |
| 9,240,736 | B2* | 1/2016 | Shimomugi | H02P 27/00 |
| 9,257,912 | B2* | 2/2016 | Hosotani | H01F 38/06 |
| 9,431,920 | B2* | 8/2016 | Sasaki | H02M 7/217 |
| 9,509,233 | B2* | 11/2016 | Ide | H02M 7/5395 |
| 9,595,890 | B2* | 3/2017 | Kondo | H02M 7/53875 |
| 9,660,519 | B2* | 5/2017 | Maruyama | H02M 1/4225 |
| 9,722,500 | B2* | 8/2017 | Usami | H02M 1/126 |
| 9,780,691 | B1* | 10/2017 | Usami | H02M 1/4225 |
| 9,979,286 | B2* | 5/2018 | Yamada | H02M 7/12 |
| 10,050,513 | B2* | 8/2018 | Iyasu | H02M 3/33592 |
| 10,075,059 | B2* | 9/2018 | Iyasu | H02M 1/088 |
| 10,211,719 | B2* | 2/2019 | Tanaka | H02M 3/33523 |
| 10,224,826 | B2* | 3/2019 | Iyasu | H02M 3/33507 |
| 10,432,100 | B2* | 10/2019 | Iyasu | H02M 3/33584 |
| 10,574,135 | B2* | 2/2020 | Matsuura | H02M 7/217 |
| 10,608,552 | B1* | 3/2020 | Choo | H02M 7/219 |
| 10,615,680 | B2* | 4/2020 | Iyasu | H02M 1/08 |
| 10,637,370 | B2* | 4/2020 | Iyasu | H02M 7/5387 |
| 2003/0043600 | A1* | 3/2003 | Morita | H02M 1/34 363/21.01 |
| 2003/0173937 | A1* | 9/2003 | Uematsu | H02M 3/1584 323/205 |
| 2008/0130336 | A1* | 6/2008 | Taguchi | H02M 3/157 363/125 |
| 2011/0175587 | A1* | 7/2011 | Hosotani | H02M 3/33515 323/283 |
| 2013/0058134 | A1* | 3/2013 | Yamada | H02M 7/217 363/17 |
| 2013/0301323 | A1* | 11/2013 | Iyasu | H02M 7/797 363/123 |
| 2013/0314958 | A1* | 11/2013 | Kern | H02J 3/383 363/80 |
| 2014/0211526 | A1* | 7/2014 | Pidutti | H02M 1/4225 363/84 |
| 2014/0247029 | A1* | 9/2014 | Krabbenborg | H02M 3/156 323/282 |
| 2016/0079873 | A1* | 3/2016 | Inoue | H01F 27/2847 363/21.04 |
| 2017/0309395 | A1 | 10/2017 | Shiraki et al. | |
| 2019/0123661 | A1* | 4/2019 | Iyasu | H02M 7/217 |
| 2019/0157974 | A1 | 5/2019 | Tomita et al. | |
| 2019/0229645 | A1* | 7/2019 | Iyasu | H02M 1/4208 |
| 2020/0153342 | A1* | 5/2020 | Takahashi | H02M 1/15 |
| 2020/0244187 | A1* | 7/2020 | Shirasawa | H02M 7/538 |

FOREIGN PATENT DOCUMENTS

| | | |
|---|---|---|
| JP | 2011-130573 A | 6/2011 |
| JP | 2015-112543 A | 6/2015 |
| JP | 2015-139337 A | 7/2015 |
| JP | 2015-186407 A | 10/2015 |
| JP | 2015-198460 A | 11/2015 |
| JP | 2016-115864 A | 6/2016 |
| WO | 2013/042539 A1 | 3/2013 |

* cited by examiner

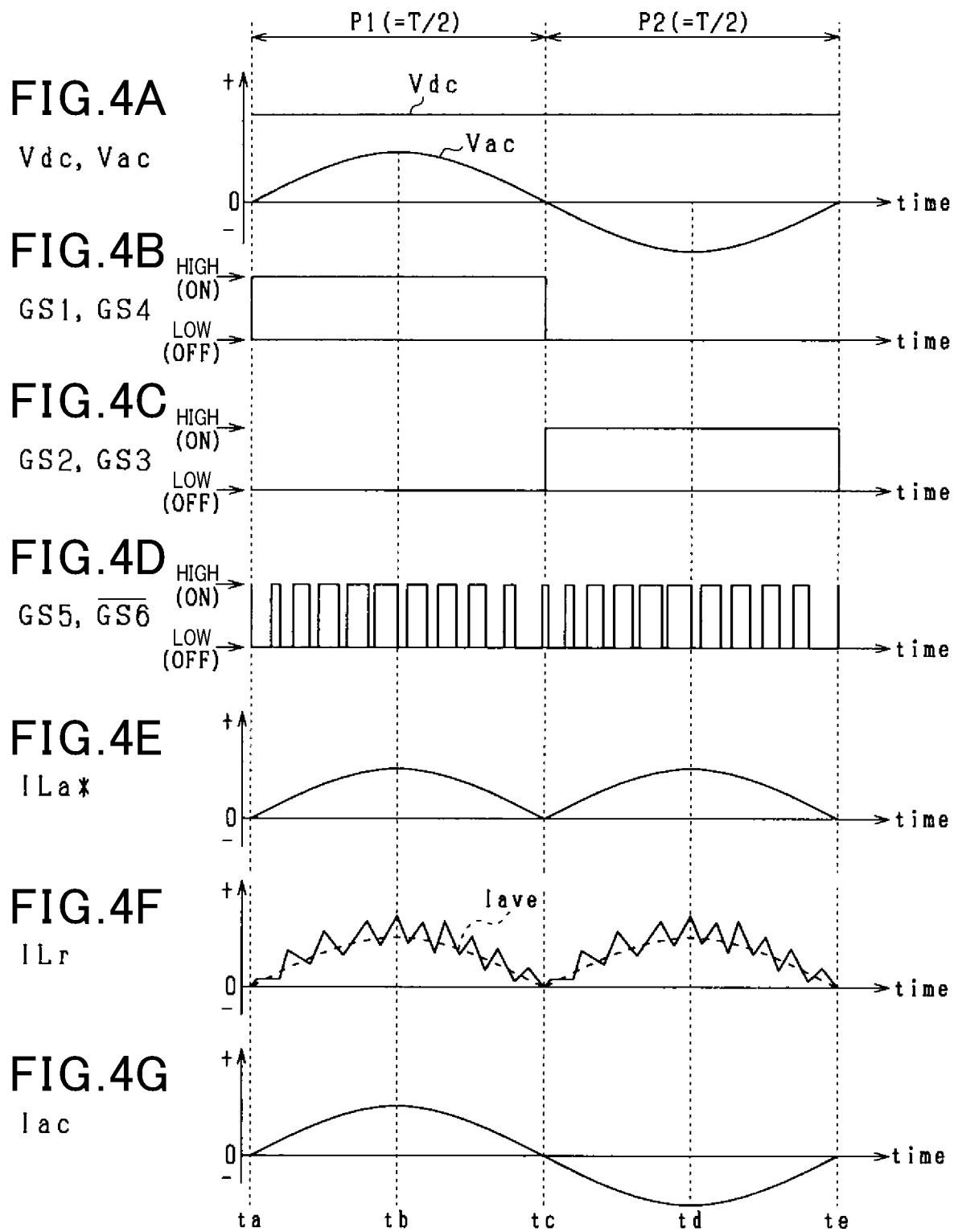

Vac, V1

GS1,GS4

GS2,GS3

Iac

Vac

OUT1

TH1,TH2

Vac

DP2

|Iac|

DP3

Vac, V1

GS1, GS4

GS2, GS3

Iac

CONTROL APPARATUS FOR POWER CONVERSION SYSTEM

CROSS REFERENCE TO RELATED APPLICATION

This application is based on and claims the benefit of priority from Japanese Patent Application No. 2018-222788 filed on Nov. 28, 2018, the disclosure of which is incorporated in its entirety herein by reference.

TECHNICAL FIELD

The present disclosure relates to control apparatuses for a power conversion system.

BACKGROUND

A known control apparatus controls on-off switching operations of each of switches in a known peak current mode to thereby adjust, to a command current value, an inductor current, i.e. a reactor current, which flows through an inductor of a power conversion apparatus, in accordance with an alternating current input to the power conversion apparatus.

SUMMARY

According to an aspect of the present disclosure, there is provided a control apparatus including a controller. The controller is configured to 1. Alternately turn on a first set of first and fourth switches and a second set of second and third switches in accordance with the polarity of an alternating-current voltage
2. Change a switching operation of at least one of the first to fourth switches being in an on state, i.e. being already in the on state, to thereby reduce a target current flowing through first and second alternating-current terminals upon determination that the target current flowing through the first and second alternating-current terminals is in an overcurrent state

BRIEF DESCRIPTION OF THE DRAWINGS

Other aspects of the present disclosure will become apparent from the following description of embodiments with reference to the accompanying drawings in which:

FIGS. 4A to 4G are a joint timing chart schematically illustrating how the power converter system operates according to the first embodiment;

DETAILED DESCRIPTION OF EMBODIMENT

Viewpoint

Figure 1:
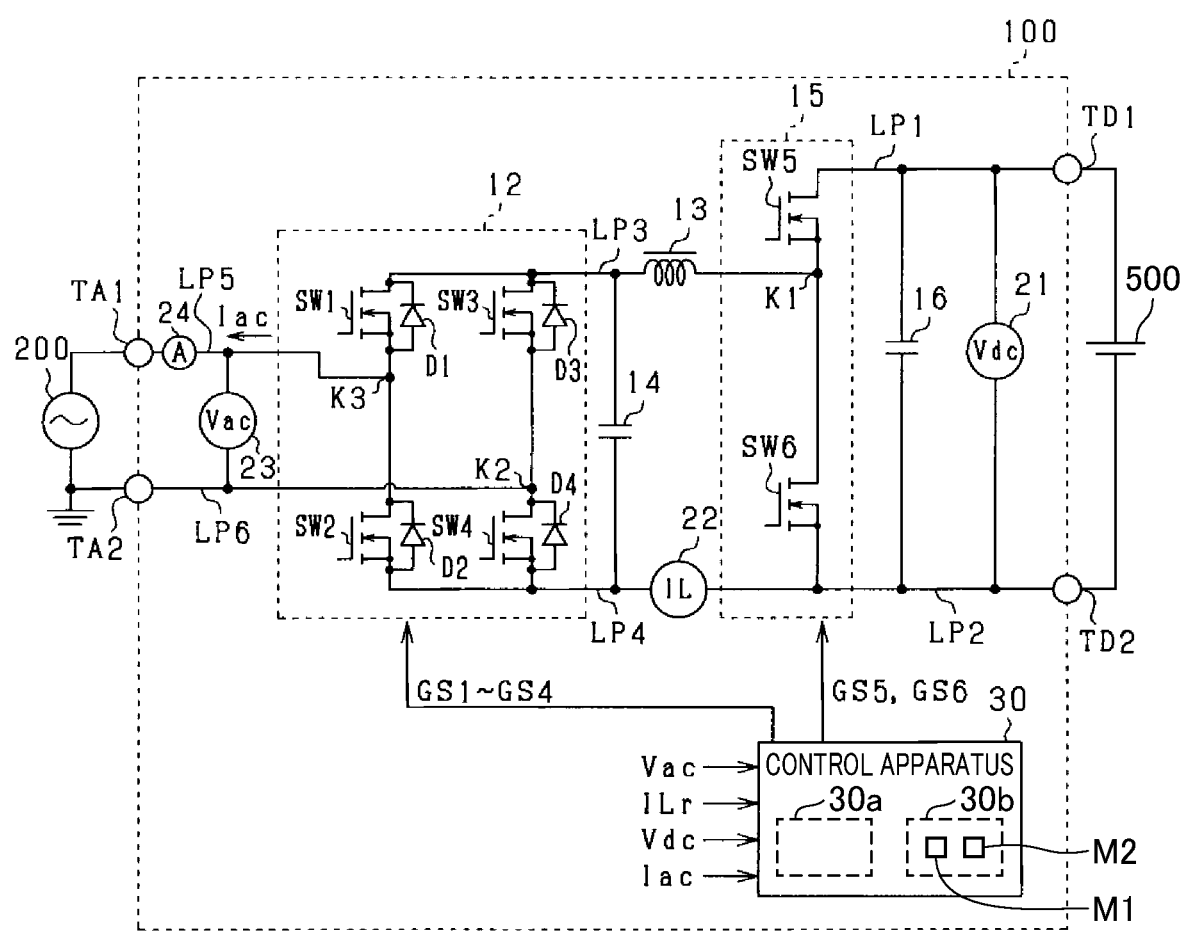
FIG. 1 is a circuit diagram schematically illustrating an example of the overall structure of a power conversion system according to the first embodiment of the present disclosure.

Japanese Patent Application Publication No. 2015-198460 discloses a control apparatus that controls on-off switching operations of each of switches in a known peak current mode to thereby adjust, to a command current value, an inductor current, i.e. a reactor current, which flows through an inductor of a power conversion apparatus, in accordance with an alternating current input to the power conversion apparatus. The control apparatus also adds, to the command current value, a current correction that depends on the phase of an input alternating-current (AC) voltage supplied from an AC power source measured by a voltage sensor. This reduces distortion, i.e. harmonic distortion, in the waveform of the alternating current.

The control apparatus disclosed in the above published patent document includes a full bridge circuit disposed between AC terminals connected to the AC power source and the inductor. Rapid change in the AC voltage supplied from the AC power source or measurement errors of the voltage sensor may cause an overcurrent to flow through the AC terminals. This may cause a need of forcibly shutting down the power conversion apparatus, making it difficult to continuously drive the power conversion apparatus.

From this viewpoint, one aspect of the present disclosure seeks to provide control apparatuses for a power conversion system including a full bridge circuit, each of which is capable of reducing the flow of an overcurrent through AC terminals of the power conversion system.

According to an exemplary aspect of the present disclosure, there is provided a control apparatus applicable to a power converter system that includes an inductor, a drive switch, first and second alternating-current terminals, first and second direct-current terminals, and a full-bridge circuit provided between the inductor and the first and second alternating-current terminals. The full-bridge circuit is comprised of first to fourth switches and first to fourth diodes connected in antiparallel to the respective first to fourth switches. The first and second switches are connected in series to each other, and the third and fourth switches are connected in series to each other. A connection point between the first and second switches is connected to the first alternating-current terminal, and a connection point between the third and fourth switches is connected to the second alternating-current terminal. The power converter system has at least one of (1) A first function of converting first alternating-current power inputted from the first and second alternating-current terminals based on an alternating-current power source into first direct-current power and outputting the first direct-current power from the first and second direct-current terminals (2) A second function of converting second direct-current power inputted from the first and second direct-current terminals into second alternating-current power and outputting the second alternating-current power from the first and second alternating-current terminals The control apparatus includes a voltage obtainer configured to obtain an alternating-current voltage having a polarity across the first and second alternating-current terminals, and an overcurrent determiner configured to determine whether a target current flowing through the first and second alternating-current terminals is in an overcurrent state.

The control apparatus includes a controller configured to
1. Alternately turn on a first set of the first and fourth switches and a second set of the second and third switches in accordance with the polarity of the alternating-current voltage
2. Change a switching operation of at least one of the first to fourth switches being in an on state, i.e. being already in the on state, to thereby reduce the target current flowing through the first and second alternating-current terminals upon determination that the target current flowing through the first and second alternating-current terminals is in the overcurrent state This configuration reduces, even if there is a phase difference between an actual alternating-current voltage and the alternating-current voltage, the flow of an overcurrent through the first and second AC terminals as the target current.

Embodiments

The following describes embodiments of the present disclosure with reference to the accompanying drawings. In the embodiments, like parts between the embodiments, to which like reference characters are assigned, are omitted or simplified to avoid redundant description.

First Embodiment

The following describes the first embodiment of the present disclosure with reference to FIGS. 1 to 13. A control apparatus 30 according to the present embodiment is embodied as a component of a power conversion apparatus 100 for converting AC power into direct-current (DC) power.

Referring to FIG. 1, the power conversion apparatus 100 includes first and second DC terminals TD1 and TD2 and first and second AC terminals TA1 and TA2. The first and second DC terminals TD1 and TD2 of the power conversion apparatus 100 are connected to a DC power source 500, such as a battery or a DC-DC converter. The first and second AC terminals TA1 and TA2 of the power conversion apparatus 100 are connected to an AC power source 200. A commercial power source can be used as the AC power source 200.

The power conversion apparatus 100 includes a full-bridge circuit 12, a half-bridge circuit 15, an inductor, i.e. a reactor, 13, an intermediate capacitor 14, a capacitor 16, and first to sixth wirings LP1 to LP6. Each of the first to sixth wirings LP1 to LP6 has opposing first and second ends. Each of the capacitors 14 and 16 has opposing first and second terminals.

The first end of the first wiring LP1 is connected to the first DC terminal TD1, and the first end of the second wiring LP2 is connected to the second DC terminal TD2. The capacitor 16 is connected between the first and second wirings LP1 and LP2 to be parallel to the DC power source 500.

The full-bridge circuit 12 includes first to fourth switches SW1 to SW4. Each of the first to fourth switches SW1 to SW4 is comprised of, for example, an N-channel MOSFET, which is an example of a voltage-controlled switch.

The source of the first switch SW1 is connected to the drain of the second switch SW2. The source of the third switch SW3 is connected to the drain of the fourth switch SW4. Each of the first to fourth switches SW1 to SW4 includes a corresponding one of flyback diodes D1 to D4 connected in antiparallel to the corresponding one of the first to fourth switches SW1 to SW4. Because each of the first to fourth switches SW1 to SW4 is comprised of an N-channel MOSFET, an intrinsic diode of each of the first to fourth switches SW1 to SW4 can serve as a flyback diode, making it possible to eliminate additional flyback diodes.

The half-bridge circuit 15 includes a fifth switch S5 and a sixth switch SW6. Each of the fifth and sixth switches SW5 and SW6 is comprised of, for example, an N-channel MOSFET, which is an example of a voltage-controlled switch; the fifth switch SW5 serves as a drive switch according to the first embodiment.

The source of the fifth switch SW5 is connected to the drain of the sixth switch SW6. The drain of the fifth switch SW5 is connected to the second end of the first wiring LP1. The source of sixth the switch SW6 is connected to the second end of the second wiring LP2.

The connection point, which will be referred to as a first connection point K1, between the source of the fifth switch SW5 and the drain of the sixth switch SW6 is connected to the first end of the third wiring LP3. The inductor 13 is mounted on the third wiring LP3. The source of the sixth switch SW6 is connected to the first end of the fourth wiring LP4.

The drain of each of the first and third switches SW1 and SW3 is connected to the second end of the third wiring LP3. The source of each of the second and fourth switches SW2 and SW4 is connected to the second end of the fourth wiring LP4. This enables the full-bridge circuit 12 and the half-bridge circuit 15 to be connected to each other via the third and fourth wirings LP3 and LP4.

The intermediate capacitor 14 is connected between the third and fourth wirings LP3 and LP4. Specifically, a point of the third wiring LP3, which is located between the full-bridge circuit 12 and the inductor 13, is connected to the first terminal of the intermediate capacitor 14, and a corresponding point of the fourth wiring LP4, which is located between the full-bridge circuit 12 and the half-bridge circuit 15, is connected to the second terminal of the intermediate capacitor 14.

The connection point, which will be referred to as a second connection point K2, between the source of the third switch and the drain of the fourth switch SW4 is connected to the first end of the sixth wiring LP6, and the second end of the sixth wiring LP6 is connected to the second AC terminal TA2. Similarly, the connection point, which will be referred to as a third connection point K3, between the source of the first switch SW1 and the drain of the second switch SW2 is connected to the first end of the fifth wiring LP5, and the second end of the fifth wiring LP5 is connected to the first AC terminal TA1.

That is, the power conversion apparats 100 has a function of converting AC power inputted from the first and second AC terminals TA1 and TA2 into DC power and outputting the DC power from the first and second DC terminals TD1 and TD2.

The power conversion apparatus 100 also includes a DC voltage sensor 21, an inductor current sensor 22, and an AC voltage sensor 23. The DC voltage sensor 21 is connected between the first wiring LP1 and the second wiring LP2, and configured to measure, as a DC voltage Vdc, a voltage across the capacitor 16 to be input to the power conversion apparatus 100 via the first and second DC terminals TD1 and TD2.

The inductor current sensor 22 is provided on the fourth wiring LP4, and configured to measure a current flowing through the inductor 13 as an inductor current ILr.

The AC voltage sensor 23 is connected between the fifth wiring LP5 and the sixth wiring LP6, and configured to measure a voltage across the AC power source 200 as an AC voltage Vac having a predetermined period T.

The first embodiment defines the polarity of the AC voltage Vac as follows.

Specifically, the AC voltage Vac has a positive polarity upon the potential at the first AC terminal TA1 being higher than the potential at the second AC terminal TA2, and has a negative polarity upon the potential at the second AC terminal TA2 being higher than the potential at the first AC terminal TA1.

The power conversion apparatus 100 also includes a current sensor 24 provided on the fifth wiring LP5, and configured to measure a current flowing through the first and second output terminals TA1 and TA2 as an output current Iac.

The first embodiment defines the polarity of the output current Iac as follows.

Specifically, the output current Iac has a positive polarity upon the output current Iac flowing from the first AC terminal TA1 to the second AC terminal TA2 via the AC power source 200, and has a negative polarity upon the output current Iac flowing from the second AC terminal TA2 to the first AC terminal TA1 via the AC power source 200.

These measurements Vdc, ILr, Vac, and Iac are sent to the control apparatus 30.

The control apparatus 30 is connected to a control terminal, i.e. the gate, of each of the first to sixth switches SW1 to SW6, and configured to control on-off switching operations of each of the first to sixth switches SW1 to SW6.

Specifically, the control apparatus 30 receives the inductor current IL measured by the inductor current sensor 22, and controls on-off switching operations of each of the fifth and sixth switches SW5 and SW6 to thereby adjust a value of the inductor current IL to be matched with a command current ILa*, which is calculated based on the AC voltage Vac. For example, the control apparatus 30 of the first embodiment is configured to repeatedly turn on or off each of the fifth and sixth switches SW5 and SW6 in a known peak current mode.

Additionally, the control apparatus 30 is configured to alternately turn on the first set of the first and fourth switches SW1 and SW4 and the second set of the second and third switches SW2 and SW3 in accordance with the polarity of the AC voltage Vac. This enables the output current Iac having the positive polarity to flow through the AC power source 200 and the first and second AC terminals TA1 and TA2 during the AC voltage Vac having the positive polarity. This also enables the output current Iac having the negative polarity to flow through the AC power source 200 and the first and second AC terminals TA1 and TA2 during the AC voltage Vac having the negative polarity.

Figure 2:
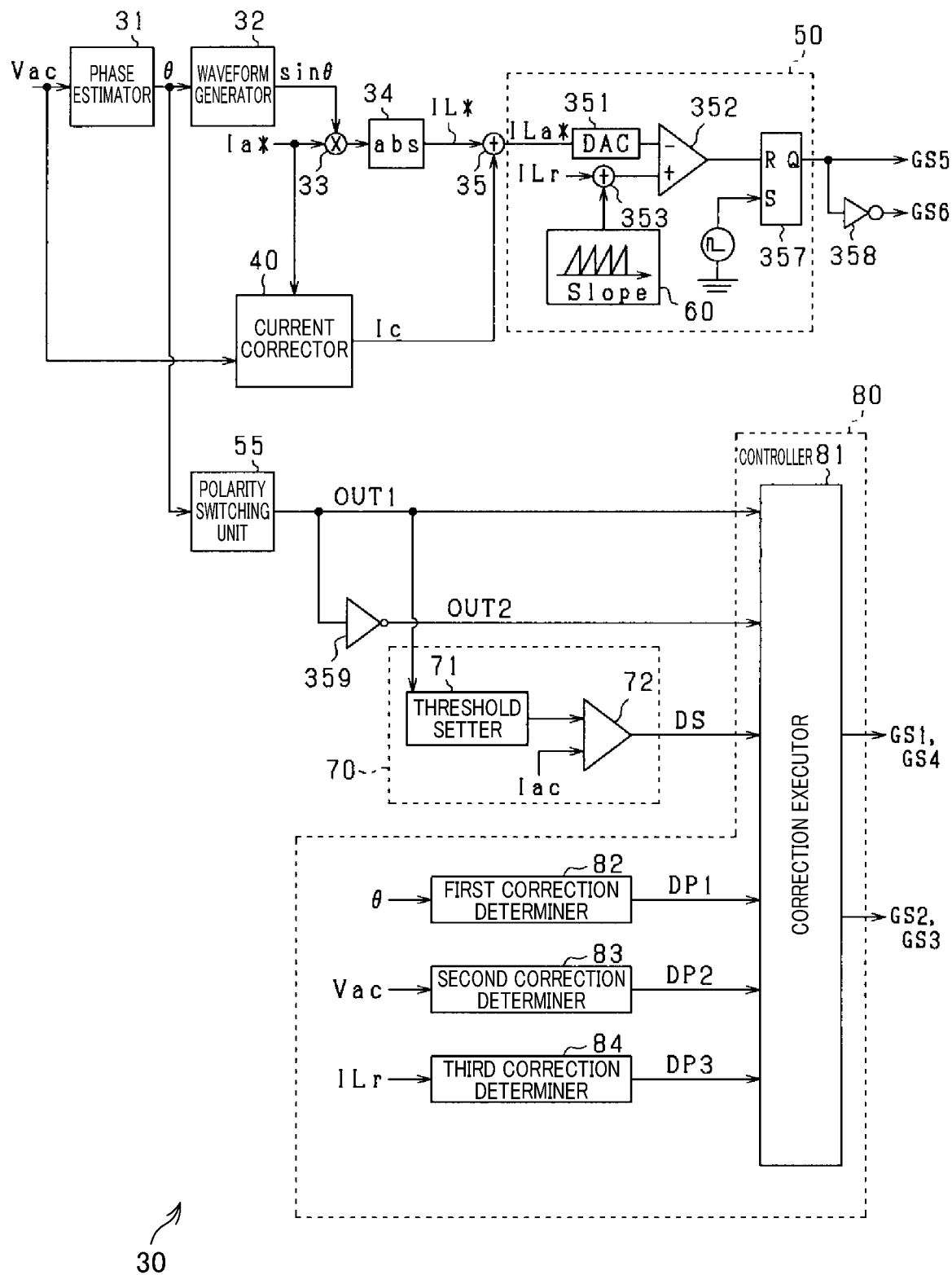
FIG. 2 is a circuitry block diagram schematically illustrating an example of the structure of a control apparatus illustrated in FIG. 1.

Next, the following describes in detail the functional structure of the control apparatus 30 with reference to FIG. 2.

Note that the control apparatus 30 is configured to, for example, manipulate information and/or data, such as measurement data items sent from the above sensors in digital data format.

For example, the control apparatus 30 functionally includes a phase estimator 31, a waveform generator 32, a multiplier 33, an absolute value calculator 34, an adder 35, a current corrector 40, a current control unit 50, and an inverter gate 358.

For example, the control apparatus 30 is comprised of at least one processor 30a and at least one memory 30b, i.e. a data storage medium, such as a nonvoluntary storage medium. The at least one processor 30a can incorporate therein the at least one memory 30b.

All the functions or functional components, which include the functional components 31 to 35, 40, and 50, provided by the control apparatus 30 can be implemented by the at least one processor 30a; the at least one processor 30a can be comprised of (1) The at least one programmable processing unit, i.e. at least one programmable logic circuit (2) At least one hardwired logic circuit (3) At least one hardwired-logic and programmable-logic hybrid circuit The phase estimator 31 estimates a phase θ of the AC voltage Vac in accordance with the AC voltage Vac.

For example, the processor 30a is configured to output a predetermined clock, that is, regular clock pulses. The phase estimator 31 counts the number of the clock pulses outputted from the CPU 30a every period, i.e. 360 degrees, of the AC voltage Vac to thereby estimate a present phase θ of the AC voltage Vac based on the counted number. For example, the phase estimator 31 estimates a timing of an upward zero-crossing of the AC voltage Vac measured by the AC voltage sensor 23 as 0 degrees of the phase θ, and estimates a timing of a downward zero-crossing of the AC voltage Vac measured by the AC voltage sensor 23 as 180 degrees of the phase θ.

The waveform generator 32 generates, based on the phase θ of the AC voltage Vac, a reference wave, i.e. a sinusoidal reference wave, sin θ that represents how the AC voltage Vac is changed for each half period (T/2); Ω represents the angular velocity of the AC voltage Vac; the reference wave sin θ has an amplitude of 1, and changes with the phase θ equal to the phase θ of the AC voltage Vac. That is, the reference wave sin θ has the same phase θ as the AC voltage Vac. Note that each half period (T/2) of the AC voltage Vac corresponds to an interval between a corresponding pair of adjacent zero-cross points of the AC voltage Vac.

The multiplier 33 multiplies an amplitude command Ia* and the reference waveform sin θ by each other, thus outputting a multiplication result expressed by "Ia*×sin θ".

Note that the amplitude command Ia* can be set based on, for example, a command value for the AC voltage Vac.

The absolute value calculator 34 calculates an absolute value of the multiplication result Ia*×sin θ to thereby calculate a value |Ia*×sin θ| as a pre-correction command current IL*. The pre-correction command current IL*, which is expressed by |Ia*×sin θ|, corresponds to, for example, a command for the inductor current ILr.

The current corrector 40 sets a current correction Ic for correcting the pre-correction command current IL*. The current correction Ic represents a correction value for reducing a degree of distortion in the AC voltage Vac.

Figure 3:
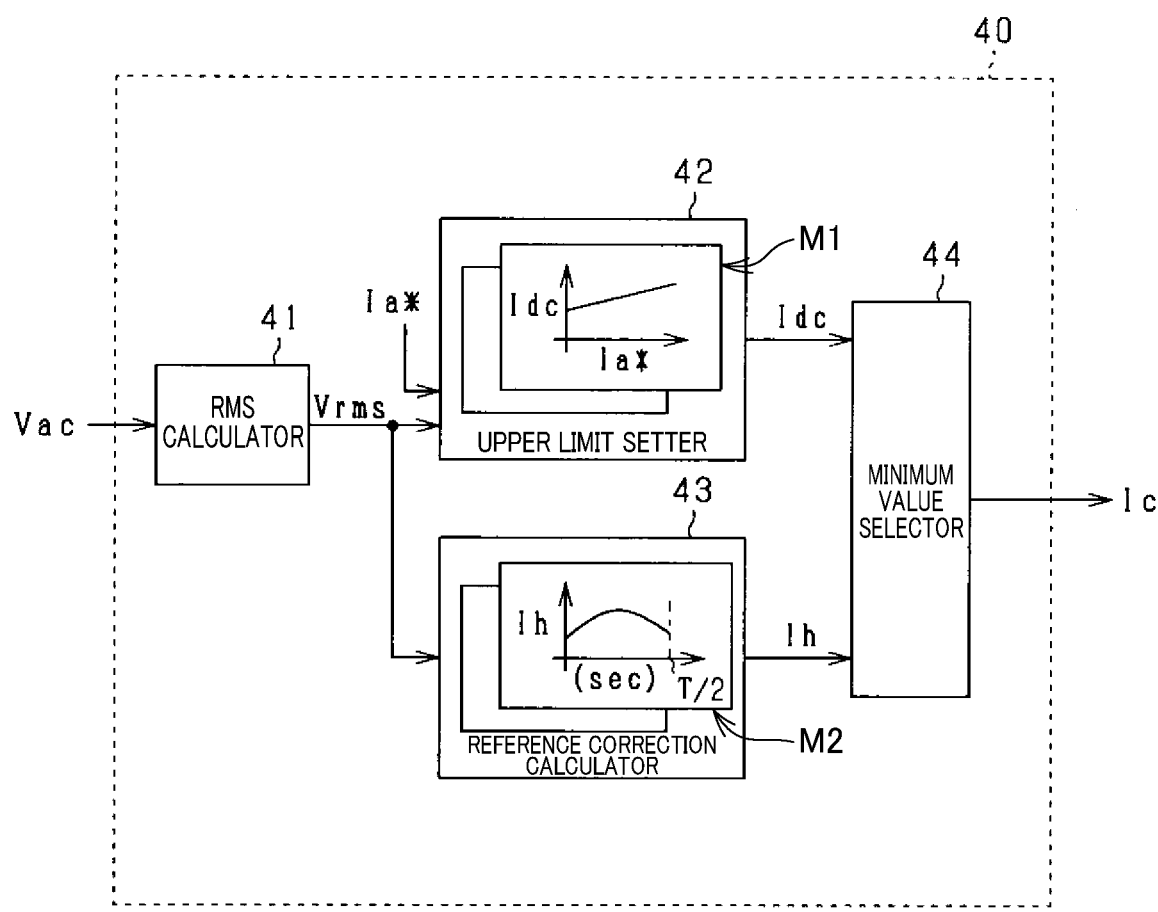
FIG. 3 is a block diagram schematically illustrating an example of the structure of a current corrector illustrated in FIG. 2.

The following describes an example of the structure of the current corrector 40 with reference to FIG. 3.

For power conversion of the DC voltage Vdc into the AC voltage Vac, the inventors have found that a deviation range parameter 4i indicative of how the pre-correction command current IL* is deviated from an average Iave of the inductor current ILr takes a smallest absolute value each time the AC voltage Vac reaches a corresponding one of zero-crossing points (see times ta, tb, and tc in FIG. 4A). This deviation range parameter Δi becomes a cause of distortion in the output current Iac.

Subtracting the average Iave of the inductor current ILr from the pre-correction command current IL* can obtain the following equation (1), and the deviation range parameter Δi can be calculated in accordance with the equation (1):

$$\Delta i = ms \cdot \frac{\sqrt{2}\,\text{Vrms} \cdot |\sin\theta|}{V dc} \cdot Tsw + \frac{\sqrt{2}\,\text{Vrms} \cdot |\sin\theta|(Vdc - \sqrt{2}\,\text{Vrms} \cdot |\sin\theta|)}{2LVdc} \cdot Tsw \quad (1)$$

where:

Tsw represents a switching cycle of each of the switches SW1 to SW6;

ms represents a variable slope of a slope compensation signal Slope described later; and Vrms represents a root-mean-square (RMS) of the AC voltage Vac.

How to derive the equation (1) will be described later.

The equation (1) shows that, for power conversion of the DC voltage Vdc into the AC voltage Vac, the deviation range parameter Δi is configured to (1) Take a local minimum value each time the AC voltage Vac reaches a corresponding one of the zero-crossing points (see times ta, tc, and to in FIG. 4A)

(2) Take a local maximum value each time the AC voltage Vac reaches a corresponding one of peaks (see times tb and td in FIG. 4A)

That is, calculating the current correction Ic based on the deviation range parameter Δi enables a degree of distortion in the output current Iac to be reduced.

For example, as illustrated in FIG. 3, the current corrector 40 includes a root-mean-square (RMS) calculator 41, an upper limit setter 42, a reference correction calculator 43, and a minimum value selector 44.

The RMS calculator 41 calculates the RMS Vrms of the AC voltage Vac.

The upper limit setter 42 is configured to set an upper limit Idc of the current correction Ic as a function of the amplitude command Ia* and the RMS Vrms of the AC voltage Vac.

Because the larger the amplitude command Ia*, the more an increase in the inductor current ILr, the upper limit setter 42 sets the upper limit Idc to be larger as the amplitude command Ia* becomes larger. In addition, the larger the RMS Vrms of the AC voltage Vac, the larger a controllable duty factor of the fifth switch SW5, resulting in an increase of the deviation range parameter Δi. For this reason, the upper limit setter 42 sets the upper limit Idc to be larger as the RMS Vrms of the AC voltage Vac becomes larger. Note that the controllable duty factor of the fifth switch SW5 represents a predetermined ratio, i.e. percentage, of on duration to the total duration of each switching cycle for the fifth switch SW5.

The upper limit setter 42 of the first embodiment has a DC component map M1 in data-table format, in mathematical expression format, and/or program format stored in, for example, the at least one memory 30b. The DC component map M1 includes information indicative of a relationship between (1) A value, i.e. a DC component, of the amplitude command Ia* for each value of the RMS Vrms (2) A value, i.e. a DC component, of the upper limit Idc for the corresponding value of the RMS Vrms For example, values of the RMS Vrms correspond to values of a commercial power source of respective countries that use the power conversion apparatus 100.

That is, the upper limit setter 42 refers to the DC component map M1, and extracts a value of the upper limit Idc corresponding to a present value of the amplitude command Ia* and a value of the RMS Vrms in the country using the power conversion apparatus 100. This makes it possible to set the upper limit Idc to a value corresponding to the present value of the amplitude command Ia*.

The reference correction calculator 43 calculates the reference correction Ih based on the RMS Vrms. For example, the reference correction calculator 43 of the first embodiment calculates the reference correction Ih such that 1. The reference correction Ih takes a local minimum value of, for example, zero, each time the AC voltage Vac passes through a corresponding one of the zero-crossing points or thereabound (see times ta, tc, and to in FIG. 4A)

(2) The reference correction Ih takes a local maximum value each time the AC voltage Vac passes through a corresponding one of the peaks or thereabound (see times tb and td in FIG. 4A)

Specifically, the reference correction Ih varies over time. Note that the reference correction Ih is set to zero each time the AC voltage Vac passes through a corresponding one of the zero-crossing points, but can be set to be a value larger than zero each time the AC voltage Vac passes through a corresponding one of the zero-crossing points.

For example, the reference correction calculator 43 has a reference correction map M2 in data-table format, in mathematical expression format, and/or program format stored in, for example, the at least one memory 30b. The reference correction map M2 includes information indicative of a relationship between values of the RMS Vrms and corresponding values of the reference correction Ih, and is designed such that, the larger the RMS Vrms, the larger the reference correction Vrms.

The minimum value selector 44 is configured to select one of the upper limit Idc set by the upper limit setter 42 and the reference correction Ih calculated by the reference correction calculator 43, thus setting the selected one of the upper limit Idc and the reference correction Ih as a vaue of the current correction Ic; the selected one of the upper limit Idc and the reference correction Ih is smaller than the other thereof.

That is, the reference correction Ih is set as the current correction Ic upon the reference correction Ih being smaller than the upper limit Idc, and the upper limit Idc is set as the current correction Ic upon the reference correction Ih being equal to or larger than the upper limit Idc.

Referring to FIG. 2, the adder 35 adds the pre-correction command current IL*, which is expressed by |Ia*×sin θ|, to the current correction Ic to thereby set the addition result, which is expressed by pa*×sin θ|+Ic), as a corrected command current ILa*. The corrected command current ILa* corresponds to, for example, a command current or a command current value.

The current control unit 50 deter mines a fifth gate signal GS5 for on-off control of the fifth switch SW5 and a sixth gate signal GS6 for on-off control of the sixth switch SW6 in accordance with the inductor current ILr measured by the inductor current sensor 22, and the corrected command current ILa*. Then, the current control unit 50 outputs the fifth and sixth gate signals, i.e. voltage signals, GS5 and GS6 to the respective fifth and six switches SW5 and SW6, thus controlling on-off switching operations of each of the fifth and sixth switches SW5 and SW6.

For example, the current control unit 50 determines, based on the inductor current ILr and the corrected command current ILa*, the fifth and sixth gate signals GS5 and GS6 in the known peak current mode.

For example, the current control unit 50 includes a digital-to-analog (D/A) converter 351, a comparator 352, an adder 353, an RS flipflop 357, and a slope compensator 60. The D/A converter 351, comparator 352, adder 353, and RS flipflop 357 serve as, for example, a current controller 50a. The current corrector 40 and the slope compensator 60 serves as, for example, a slope compensation unit.

The comparator 352 has a non-inverting input terminal, an inverting input terminal, and an output terminal.

The D/A converter 351 converts the corrected command current ILa*, which has a digital signal format, into the corrected command current ILa*, which has an analog signal format, and inputs the corrected command current ILa*, which has the analog signal format, to the inverting input terminal of the comparator 352.

The slope compensator 60 generates a slope compensation signal Slope in accordance with the AC voltage Vac, the DC voltage Vdc, and the current correction Ic, and outputs the slope compensation signal Slope to the adder 353. The slope compensation signal Slope has a variable slope, and is configured to compensate for increasing and decreasing slopes of the inductor current ILr to thereby reduce oscillation of the inductor current ILr.

The adder 353 adds the slope compensation signal Slope to the inductor current ILr, that is, calculates the sum of the slope compensation signal Slope and the inductor current ILr. Then, the adder 353 inputs the sum (Slope+ILr) of the slope compensation signal Slope and the inductor current ILr to the non-inverting input terminal of the comparator 352. The sum (Slope+ILr) of the slope compensation signal Slope and the inductor current ILr will be referred to as a slope-corrected inductor current (Slope+ILr).

The flipflop 357 has a reset terminal (R), a set terminal (S), and an output terminal (Q).

The comparator 352 compares the corrected command current ILa* input to the inverting input terminal with the slope-corrected inductor current (Slope+ILr) input to the non-inverting input terminal to thereby output a high-level signal, which is, for example, a predetermined high voltage signal, to the reset terminal R of the flipflop 357 while the slope-corrected inductor current (Slope+ILr) is lower than the corrected command current ILa*.

Additionally, the processor 30a is configured to transmit the regular clock pulses to the set terminal S of the flipflop 357, and the inverter gate 358 has input and output terminals. The output terminal Q of the flipflop 357 is connected to the gate of the fifth switch SW5 and to the input terminal of the inverter gate 358. The output terminal of the inverter gate 358 is connected to the gate of the sixth switch SW6. The cycle of the clock pulses of the clock is used as the switching cycle set to the switching cycle Tsw of each of the fifth and sixth switches SW5 and SW6.

That is, when a present clock pulse of the clock rises, a high-voltage signal is output from the flipflop 357 to the gate of the fifth switch SW5 as the fifth gate signal GS5 with a high voltage level indicative of an on command, so that the fifth switch SW5 is turned on. In contrast, the high-voltage signal is output from the flipflop 357 to the inverter gate 358, so that a low-voltage signal with a low voltage level indicative of an off command, which is the inverse of the level of the fifth gate signal GS5, is input to the gate of the sixth switch SW6 as the sixth gate signal GS6. This results in the sixth switch SW6 being turned off.

While the slope-corrected inductor current (Slope+ILr) is lower than the corrected command current ILa*, the on state of the fifth switch SW5 and the off state of the sixth switch SW6 are maintained. When the slope-corrected inductor current (Slope+ILr) becomes identical to the corrected command current ILa*, the high-voltage signal is input to the reset terminal R of the flipflop 357, so that the low-voltage signal is output from the flipflop 357 to the gate of the fifth switch SW5 as the fifth gate signal GS5 with the low voltage level indicative of the off command. In contrast, the low-voltage signal is output from the flipflop 357 to the inverter gate 358, so that the high-voltage signal indicative of the on command, which is the inverse of the level of the fifth gate signal GS5, is input to the gate of the sixth switch SW6 as the sixth gate signal GS6.

Next, the following describes how the power converter system 100 operates with reference to FIGS. 4A to 4G.

FIG. 4A schematically illustrates how the AC voltage Vac and the DC voltage Vdc are changed over time, FIG. 4B schematically illustrates how each of the first and fourth gate signals GS1 and GS4 is changed over time, and FIG. 4C schematically illustrates how the second and third gate signals GS2 and GS3 is changed over time. FIG. 4D schematically illustrates how each of the fifth gate signal GS5 and the inverse of the sixth gate signal GS6 is changed over time.

FIG. 4E schematically illustrates how the corrected command current ILa* is changed over time, FIG. 4F schematically illustrates how the inductor current ILr is changed over time, and FIG. 4G schematically illustrates how the alternating current Iac is changed over time.

As described above, each of the times ta, tc, and te represents a corresponding one of the zero-crossing points of the AC voltage Vac during a selected period T thereof. Specifically, each of the times ta and te represents the upward zero-crossing of the AC voltage Vac at which the AC voltage Vac changes from the negative to the positive, and the time tc represents the downward zero-crossing of the AC voltage Vac at which the AC voltage Vac changes from the positive to the negative.

In addition, the time tb represents the positive peak of the AC voltage Vac during the selected period T thereof, and the time td represents the negative peak of the AC voltage Vac during the selected period T.

For improvement of the power factor of the AC voltage Vac supplied to the AC power source 200, the control apparatus 30 calculates the corrected command current ILa* as a function of the AV voltage Vac. This results in the corrected command current ILa* being changed such that a positive half of a sinusoidal wave appears for each half (T/2) of the period T of the AC voltage Vac. For this reason, the corrected command current ILa* increases during each of the zero-crossing timings ta and tc to the corresponding adjacent one of the peak timings tb and td, and decreases during each of the peak timings tb and td to the corresponding adjacent one of the zero-crossing timings tc and te.

The control apparatus 30 is configured to (1) Raise each of the first and fourth gate signals GS1 and GS4 from the low voltage level to the high voltage level while dropping each of the second and third gate signals GS2 and GS3 from the high voltage level to the low voltage level when the AC voltage Vac changes from the negative to the positive at the start of a first period P1 of the AC voltage Vac in the selected period T; the first period P1 corresponds to the positive half period of the AC voltage Vac (2) Maintain each of the first and fourth gate signals GS1 and GS4 at the high voltage level while maintaining each of the second and third gate signals GS2 and GS3 at the low voltage level during the first period P1 of the AC voltage Vac in the selected period T This causes each of the first and fourth switches SW1 and SW4 to be in the on state and each of the second and third switches SW2 and SW3 to be in the off state.

During the first period P1, the control apparatus 30 is configured to control the fifth and sixth switches SW5 and SW6 in the peak current mode to thereby adjust the inductor current ILr to the corrected command current ILa*.

Specifically, when the present clock pulse of the clock rises, the current control unit 50 causes the flipflop 357 to output the high-voltage signal to the gate of the fifth switch SW5 as the on command of the fifth gate signal GS5 to thereby turn on the fifth switch SW5, and output, via the inverter gate 358, the low-voltage signal to the gate of the sixth switch SW6 as the off command of the sixth gate signal GS6 to thereby turn off the sixth switch SW6.

While the slope-corrected first inductor current (Slope+ IL1r) is lower than the corrected command current ILa*, the current control unit 50 maintains the on command of the fifth gate signal GS5 and the off command of the sixth gate signal GS6, thus maintaining the on state of the fifth switch SW5 and the off state of the sixth switch SW6.

During the on state of the fifth switch SW5 with the sixth switch SW6 being in the off state, the inductor current ILr flows from the DC power source 500 through the inductor 13, the first switch SW1, the AC power source 200, and the fourth switch SW4 to the DC power source 500. This enables magnetic energy to be charged in the inductor 13.

When the slope-corrected first inductor current (Slope+ IL1r) becomes identical to the corrected command current ILa*, the current control unit 50 causes the high-voltage signal to be input to the reset terminal R of the flipflop 357. This outputs the low-voltage signal from the flipflop 357 to the gate of the fifth switch SW5 as the off command of the fifth gate signal GS5, thus turning off the fifth switch SW5, and outputs, via the inverter gate 358, the high-voltage signal to the gate of the sixth switch SW6 as the on command of the sixth gate signal GS6 to thereby turn on the sixth switch SW6.

During the off state of the fifth switch SW5 with the sixth switch SW6 being in the off state, the inductor current ILr based on the magnetic energy charged in the inductor 13 flows through the first switch SW1, the AC power source 200, the fourth switch SW4, and the sixth switch SW6.

In particular, the control apparatus 30 controls a controllable duty factor of each of the fifth and sixth gate signals GS5 and GS6 to thereby adjust the inductor current ILr to the corrected command current ILa* during the first period P1. The controllable duty factor of, for example, the fifth gate signal GS5 represents a predetermined ratio, i.e. percentage, of the duration of the high-voltage level to the total duration of the high and low voltage levels for each switching cycle Tsw. That is, the controllable duty factor of, for example, the fifth gate signal GS5 of the fifth switch SW5 represents a predetei mined ratio, i.e. percentage, of on duration to the total duration of each switching cycle for the fifth switch SW5.

Under control of each of the fifth and sixth switches SW5 and SW6 based on the corresponding duty factor, the inductor current ILr during each switching cycle Tsw depends on the duty factor of the fifth switch SW5, making it possible to adjust the average Iave of the inductor current ILr to be close to the command current ILa*.

After lapse of the first period P1, the control apparatus 30 is configured to (1) Drop each of the first and fourth gate signals GS1 and GS4 from the high voltage level to the low voltage level while raising each of the second and third gate signals GS2 and GS3 from the low voltage level to the high voltage level when the AC voltage Vac changes from the positive to the negative at the start of a second period P2 of the AC voltage Vac in the selected period T; the second period P2 corresponds to the negative half period of the AC voltage Vac (2) Maintain each of the first and fourth gate signals GS1 and GS4 at the low voltage level while maintaining each of the second and third gate signals GS2 and GS3 at the high voltage level during the second period P2 of the AC voltage Vac in the selected period T This causes each of the first and fourth switches SW1 and SW4 to be in the off state and each of the second and third switches SW2 and SW3 to be in the on state.

During the second period P2, the control apparatus 30 is configured to control the fifth and sixth switches SW5 and SW6 in the peak current mode to thereby adjust the inductor current ILr to the corrected command current ILa*.

Specifically, when the present clock pulse of the clock rises, the current control unit 50 causes the flipflop 357 to output the high-voltage signal to the gate of the fifth switch SW5 as the on command of the fifth gate signal GS5 to thereby turn on the fifth switch SW5, and output, via the inverter gate 358, the low-voltage signal to the gate of the sixth switch SW6 as the off command of the sixth gate signal GS6 to thereby turn off the sixth switch SW6.

While the slope-corrected first inductor current (Slope+ IL1r) is lower than the corrected command current ILa*, the current control unit 50 maintains the on command of the fifth gate signal GS5 and the off command of the sixth gate signal GS6, thus maintaining the on state of the fifth switch SW5 and the off state of the sixth switch SW6.

During the on state of the fifth switch SW5 with the sixth switch SW6 being in the off state, the inductor current ILr flows from the DC power source 500 through the inductor 13, the third switch SW3, the AC power source 200, and the second switch SW2 to the DC power source 500. This enables magnetic energy to be charged in the inductor 13.

When the slope-corrected first inductor current (Slope+ IL1r) becomes identical to the corrected command current ILa*, the current control unit 50 causes the high-voltage signal to be input to the reset terminal R of the flipflop 357. This outputs the low-voltage signal from the flipflop 357 to the gate of the fifth switch SW5 as the off command of the fifth gate signal GS5, thus turning off the fifth switch SW5, and outputs, via the inverter gate 358, the high-voltage signal to the gate of the sixth switch SW6 as the on command of the sixth gate signal GS6 to thereby turn on the sixth switch SW6.

During the off state of the fifth switch SW5 with the sixth switch SW6 being in the off state, the inductor current ILr based on the magnetic energy charged in the inductor 13 flows through the third switch SW3, the AC power source 200, the second switch SW2, and the sixth switch SW6.

In particular, the control apparatus 30 controls the controllable duty factor of each of the fifth and sixth gate signals GS5 and GS6 to thereby adjust the inductor current ILr to the corrected command current ILa* during the second period P2 in the same manner as the above control during the first period P1.

As described above, the control apparatus 30 is configured to synchronize the on-off switching timings of each of the first to fourth switches SW1 to SW4, which constitute the full-bridge circuit 12, with the corresponding polarity switching timings of the AC voltage Vac. For example, the control apparatus 30 synchronizes the turn-on timing of the first switch SW1 with the polarity switching timing of the AC voltage Vac from the negative to the positive.

A deviation in phase between an actual AC voltage V1 of the AC power source 200 and the AC voltage Vac measured by the AC voltage sensor 23 however may cause the on-off switching timings of each of the first to fourth switches SW1 to SW4 to deviate from the corresponding polarity switching timings of the actual AC voltage V1.

A deviation in phase between the actual AC voltage V1 and the AC voltage Vac may result from, for example, rapid change in the actual AC voltage V1 and/or measurement errors of the AC voltage sensor 23. This phase deviation may cause a bypass circuit in the full-bridge circuit 12, resulting in an overcurrent flowing through the first and second AC terminals TA1 and TA2.

The following describes a case where an overcurrent flows in the full-bridge circuit 12 due to a phase deviation between the actual AC voltage V1 and the AC voltage Vac with reference to FIGS. 5A to 5D, 6A and 6B.

Figure 5A:
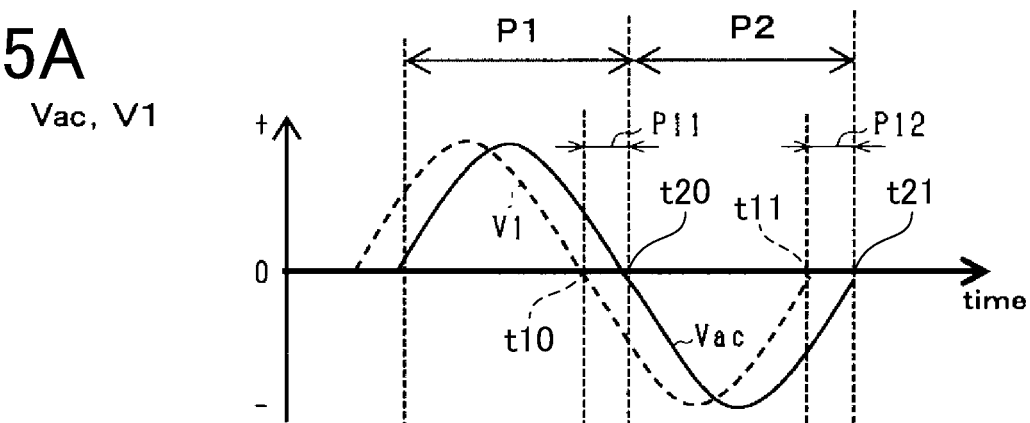
FIGS. 5A to 5D are a joint timing chart schematically illustrating how predetermined parameters of the power converter system are changed in a case where an overcurrent flows in a full-bridge circuit due to a phase deviation between an actual AC voltage and an AC voltage.
Figure 5B:
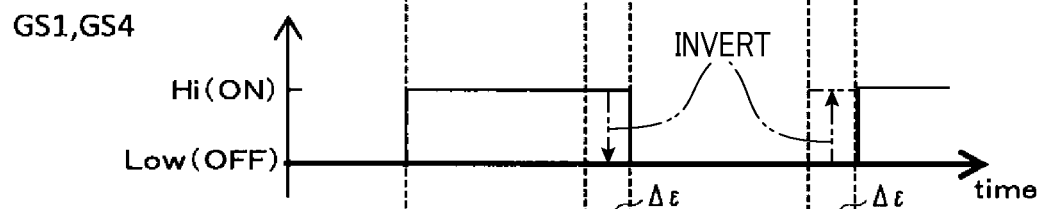
Figure 5C:
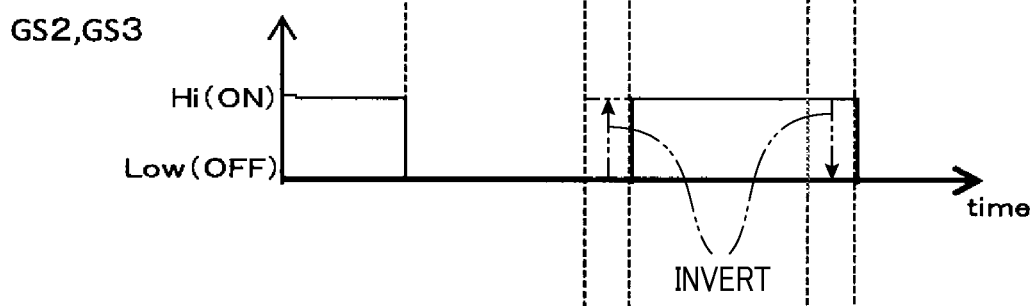
Figure 5D:
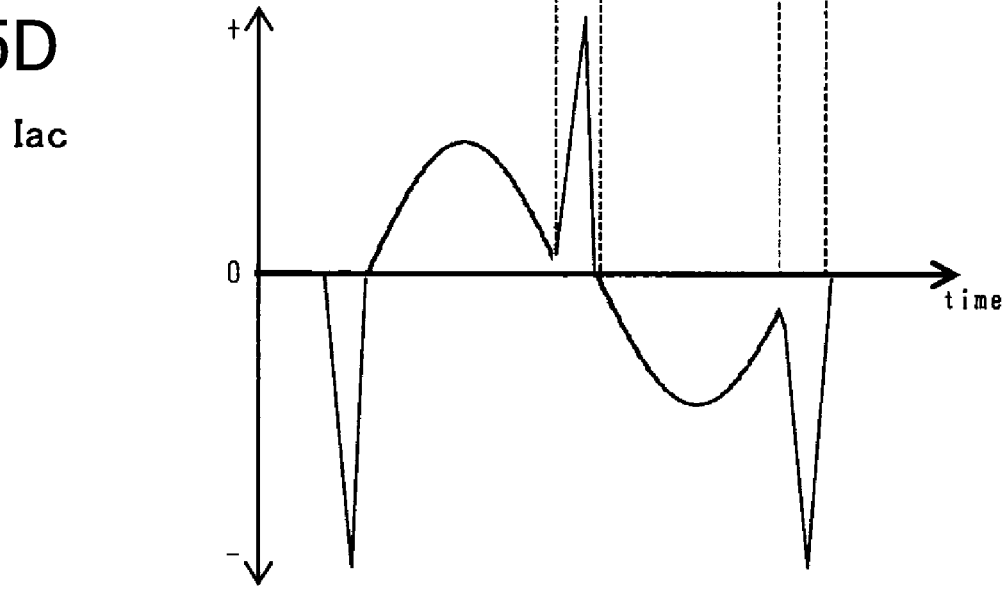

FIG. 5A schematically illustrates how the AC voltage Vac and the actual AC voltage V1 are changed over time, and FIG. 5B schematically illustrates how each of the first and fourth gate signals GS1 and GS4 is changed over time. FIG. 5C schematically illustrates how each of the second and third gate signals GS2 and GS3 is changed over time, and FIG. 5D schematically illustrates how the output current Iac is changed over time.

Figure 6A:
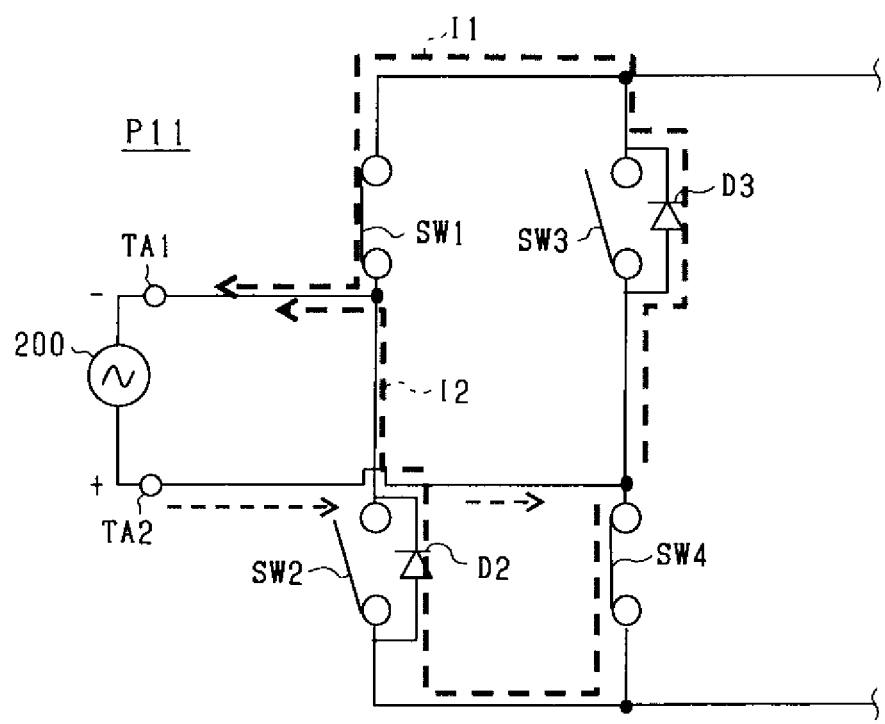
FIG. 6A is a graph schematically illustrating how a current flows through the full-bridge circuit and an AC power source during a period (see reference character P11 in FIGS. 5A to 5D)

FIG. 6A schematically illustrates how a current flows through the full-bridge circuit 12 and the AC power source 200 during a period P11 illustrated in FIGS. 5A to 5D, and FIG. 6B schematically illustrates how a current flows through the full-bridge circuit 12 and the AC power source 200 during a period P12 illustrated in FIGS. 5A to 5D.

The AC voltage Vac illustrated in FIG. 5A is delayed in phase relative to the actual AC voltage V1. This phase delay causes the falling timing of each of the first and fourth gate signals GS1 and GS4 to be delayed relative to the corresponding zero-crossing timing t10 of the actual AC voltage V1 by a time $\Delta\varepsilon$ during the first period P1 corresponding to the positive half period of the AC voltage Vac.

Similarly, this phase delay causes the rising timing of each of the second and third gate signals GS2 and GS3 to be delayed relative to the corresponding zero-crossing timing t11 of the actual AC voltage V1 by the time $\Delta\varepsilon$ during the first period P1 corresponding to the positive half period of the AC voltage Vac.

In particular, during a period P11 between the zero-crossing timing t10 of the actual AC voltage V1 and the zero-crossing timing t20 of the AC voltage Vac, the actual AC voltage V1 is negative, but the AC voltage Vac is positive.

As illustrated in FIG. 6A, a negative value of the actual AC voltage V1 applied between the first and second AC terminals TA1 and TA2 during the period P11 causes a first current I1 to flow through a closed circuit, i.e. a first positive-current bypass circuit, comprised of the intrinsic diode D3 of the third switch SW3 and the drain-source channel of the first switch SW1 in the direction from the first AC terminal TA1 to the second AC terminal TA2 via the AC power source 200. Similarly, the negative value of the actual AC voltage V1 applied between the first and second AC terminals TA1 and TA2 during the period P11 causes a second current I2 to flow through a closed circuit, i.e. a second positive-current bypass circuit, comprised of the drain-source channel of the fourth switch SW4 and the intrinsic diode D2 of the second switch SW2 in the direction from the first AC terminal TA1 to the second AC terminal TA2 via the AC power source 200.

For this reason, the output current Iac during the period P11 becomes an overcurrent that has the sum of the first and second currents I1 and I2 (see FIG. 5D).

Additionally, the phase delay of the AC voltage Vac relative to the actual AC voltage V1 causes the rising timing of each of the first and fourth gate signals GS1 and GS4 to be delayed relative to the corresponding zero-crossing timing t11 of the actual AC voltage V1 by the time $\Delta\varepsilon$ during the second period P2 corresponding to the negative half period of the AC voltage Vac.

Similarly, the phase delay of the AC voltage Vac relative to the actual AC voltage V1 causes the falling timing of each of the second and third gate signals GS2 and GS3 to be delayed relative to the corresponding zero-crossing timing t11 of the actual AC voltage V1 by the time $\Delta\varepsilon$ during the second period P2 corresponding to the negative half period of the AC voltage Vac.

In particular, during a period P12 between the zero-crossing timing t11 of the actual AC voltage V1 and the zero-crossing timing t21 of the AC voltage Vac, the actual AC voltage V1 is positive, but the AC voltage Vac is negative.

Figure 6B:
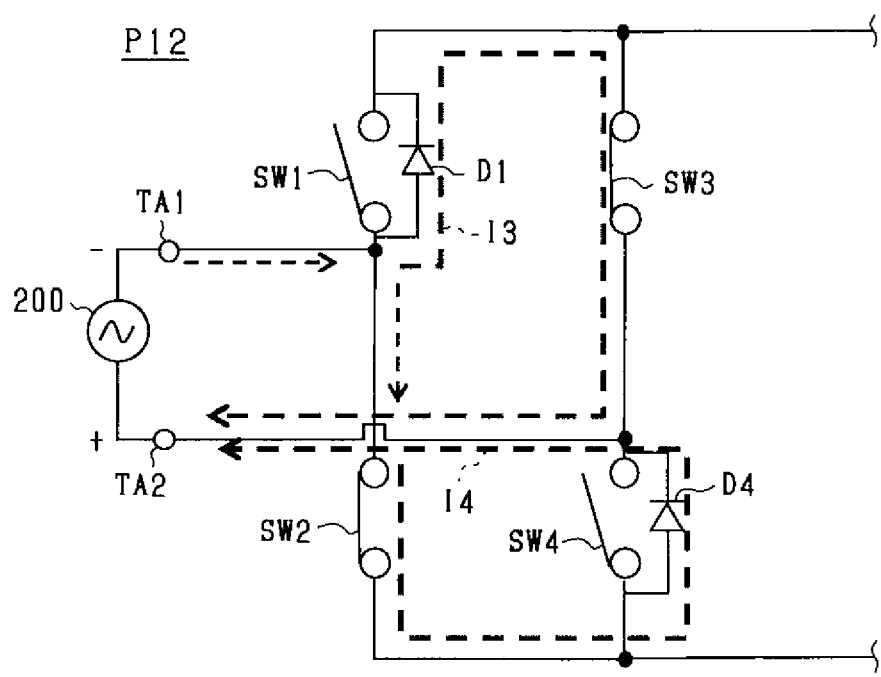
FIG. 6B is a graph schematically illustrating how a current flows through the full-bridge circuit and the AC power source during a period (see reference character P12 in FIGS. 5A to 5D)

As illustrated in FIG. 6B, a positive value of the actual AC voltage V1 applied between the first and second AC terminals TA1 and TA2 during the period P12 causes a third current I3 to flow through a closed circuit, i.e. a first positive-current bypass circuit, comprised of the intrinsic diode D1 of the first switch SW1 and the drain-source channel of the third switch SW3 in the direction from the second AC terminal TA2 to the first AC terminal TA1 via the AC power source 200.

Similarly, the positive value of the actual AC voltage V1 applied between the first and second AC terminals TA1 and TA2 during the period P12 causes a fourth current I4 to flow through a closed circuit, i.e. a second positive-current bypass circuit, comprised of the drain-source channel of the second switch SW2 and the intrinsic diode D4 of the fourth switch SW4 in the direction from the second AC terminal TA2 to the first AC terminal TA1 via the AC power source 200.

For this reason, the output current Iac during the period P12 becomes an overcurrent that has the sum of the third and fourth currents I3 and I4 (see FIG. 5D).

An overcurrent flowing through the first and second AC terminals TA1 and TA2 may cause the power conversion system 100 to be unlikely to operate with stability.

From this viewpoint, the control apparatus 30 is configured to invert the on/off state of each of the first to fourth switches SW1 to SW4, which constitute the full-bridge circuit 12, when the output current Iac is in an overcurrent state to thereby reduce the excessive value of the output current Iac.

Specifically, during the period P11, the control apparatus 30 is configured to
1. Invert the on sate, i.e. high state, of each of the first and fourth switches SW1 and SW4 to the off state, i.e. low state
2. Invert the off sate, i.e. low state, of each of the second and third switches SW2 and SW3 to the on state, i.e. high state (see FIGS. 5B and 5C)

Additionally, during the period P12, the control apparatus 30 is configured to
1. Invert the off sate, i.e. low state, of each of the first and fourth switches SW1 and SW4 to the on state, i.e. high state
2. Invert the on sate, i.e. high state, of each of the second and third switches SW2 and SW3 to the off state, i.e. low state (see FIGS. 5B and 5C)

This configuration reduces the flowing of an overcurrent due to the phase deviation between the AC voltage Vac and the actual AC voltage V1 between the first and second AC terminals TA1 and TA2.

As an example of reducing the flowing of an overcurrent between the first and second AC terminals TA1 and TA2, the control apparatus 30 additionally includes a polarity switching unit 55, an inverter gate 359, an overcurrent determiner 70, and a controller 80.

The polarity switching unit 55 is configured to output a first level signal OUT1 having a selected one of a high level and a low level in accordance with the phase $\theta$ of the AC voltage Vac.

As described above, according to the phase $\theta$ of the AC voltage Vac is set to 0 degrees at the upward zero-crossing of the AC voltage Vac for every period T, the polarity switching unit 55 of the first embodiment is configured to selectively output one of (1) The first level signal OUT1 having the high level while the phase $\theta$ of the AC voltage Vac is within the range from 0 degrees inclusive to 180 degrees exclusive (2) The first level signal OUT1 having the low level while the phase $\theta$ of the AC voltage Vac is within the range from 180 degrees inclusive to 360 degrees exclusive The inverter gate 359 is configured to receive the first level signal OUT1, and logically invert the first level signal OUT1 to thereby output a level signal having a level that is an inversion of the level of the first level signal OUT1 as a second level signal OUT2.

The overcurrent determiner 70 is configured to receive the first level signal OUT1, and determine, based on the first level signal OUT1, whether the output current Iac is in the overcurrent state. The controller 80 is configured to generate the first to fourth gate signals SW1 to SW4 in accordance with the first level signal OUT1, the second level signal OUT2, and the determination result outputted from the current determiner 70.

Specifically, the overcurrent determiner 70 includes a threshold setter 71 and a comparator 72.

The threshold setter 71 is configured to selectively output, based on the logical level of the first level signal OUT1, one of (1) A positive value of an overcurrent threshold TH1

(2) A negative value of the overcurrent threshold TH1, the absolute of the negative value of which is identical to the absolute of the positive value of the overcurrent threshold TH1

The comparator 72 has a first input terminal connected to the threshold setter 71, a second input terminal to which the output current Iac is inputted, and an output terminal connected to the controller 80.

The absolute of each of the positive and negative values of the overcurrent threshold TH1 is set for determining whether the output current Iac is in the overcurrent state, and for example set to be higher than a rated current of each of the switches SW1 to SW4.

Figure 7A:
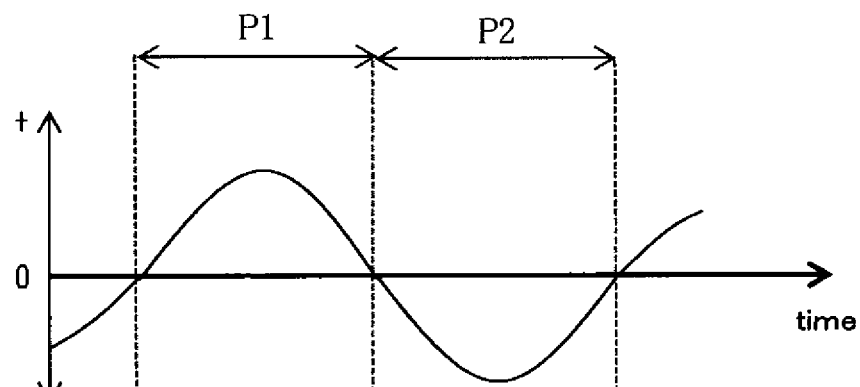
FIGS. 7A to 7C are a joint timing chart schematically illustrating how an overcurrent threshold outputted from a threshold setter works.
Figure 7B:
Figure 7C:
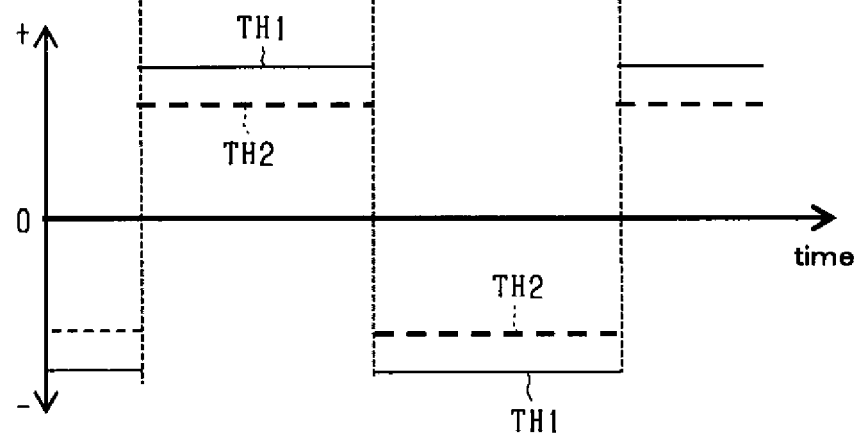

FIGS. 7A to 7C schematically illustrate how the overcurrent threshold TH1 outputted from the threshold setter 71 works. FIG. 7A schematically illustrates how the AC voltage Vac is changed over time, FIG. 7B schematically illustrates how the first level signal OUT1 is changed over time, and FIG. 7C schematically illustrates how each of the overcurrent threshold TH1 and a recovery threshold TH2 described later is changed over time.

As illustrated in FIGS. 7A and 7B, because the phase $\theta$ of the AC voltage Vac is located within 0 degrees inclusive to 180 degrees exclusive during the first period P1, the first level signal OUT1 outputted from the polarity switching unit 55 has the high level. In contrast, because the phase $\theta$ of the AC voltage Vac is located within 180 degrees inclusive to 360 degrees exclusive during the second period P2, the first level signal OUT1 outputted from the polarity switching unit 55 has the low level.

The threshold setter 71 outputs, to the first input terminal of the comparator 72, the positive value of the overcurrent threshold TH1 upon the first level signal OUT1 outputted from the threshold setter 55 having the high level, and outputs, to the first input terminal of the comparator 72, the negative value of the overcurrent threshold TH1 upon the first level signal OUT1 outputted from the threshold setter 55 having the low level. That is, the threshold setter 71 switches the polarity of the overcurrent threshold TH1 between the positive and the negative in accordance with the phase $\theta$ of the AC voltage Vac, because the polarity of the AC voltage Vac is changed depending on its phase $\theta$.

When the output current Iac, which has been in the overcurrent state, is changed to decrease, the output current Iac totally decreases while alternately rises up and falls down bit by bit, resulting in a certain amount of time required for the variations of the output current Iac converge to zero. From this viewpoint, the threshold setter 71 defines a recovery threshold TH2 having an absolute value smaller than the absolute value of the overcurrent threshold TH1. The recovery threshold TH2 serves as, for example, a current recovery threshold according to the first embodiment. After the output current Iac is in the overcurrent state, the overcurrent determiner 70 is configured to determine that the overcurrent state of the output current Iac has recovered to be in a normal state upon the absolute value of the output current Iac becoming equal to or less than the recovery threshold TH2.

As described above, the output current Iac measured by the output current sensor 24 is input to the second input terminal of the comparator 72, and the overcurrent threshold TH1 or the recovery threshold TH2 is input to the first input terminal of the comparator 72.

Then, the comparator 72 is configured to output, to the controller 80, an overcurrent determination signal DS having the high level upon the output current Iac being higher than the overcurrent threshold TH1 and output, to the controller 80, the overcurrent signal DS having the low level upon the output current Iac being equal to or lower than the overcurrent threshold TH1.

Similarly, the comparator 72 is configured to output, to the controller 80, the overcurrent determination signal DS having the high level upon the output current Iac being higher than the recovery threshold TH2 and output, to the controller 80, the overcurrent signal DS having the low level upon the output current Iac being equal to or lower than the overcurrent threshold TH2.

The controller 80 includes a correction executor 81, a first correction determiner 82, a second correction deter miner 83, and a third correction determiner 84.

The correction executor 81 is configured to correct the first level signal OUT1 outputted from the polarity switching unit 55, and correct the second level signal OUT2 outputted from the invertor gate 72. Each of the first to third correction determiner 82 to 84 is configured to determine whether to provide permission to the correction executor 81 to correct each of the first and second level signals OUT1 and OUT2.

A noise signal superimposed on the output current Iac measured by the output current sensor 24 may cause the overcurrent determiner 70 to erroneously determine that the output current Iac is in the overcurrent state. In this case, inverting the on or off state of each of the first to fourth switches SW1 to SW4 would have an adverse impact on operations of the power conversion system 100.

Regarding this situation, the inventors have found that an overcurrent is likely to flow, due to the phase deviation between the actual AC voltage V1 and the AC voltage Vac, through the first and second AC terminals TA1 and TA2 at a zero-crossing point of the AC voltage Vac or therearound.

From this viewpoint, the first correction determiner 82 is configured to output a first determination signal DP1, i.e. a pulse signal, having the high level upon the phase θ of the AC voltage Vac being within a predetermined correction enabling period PP1; the correction enabling period PP1 is set for each zero-crossing point such that the correction enabling period PP1 contains a phase θ1, which will be referred to as a reference phase θ1, of the corresponding zero-crossing point, a predetermined negative angular margin (−X) relative to the corresponding zero-crossing point, and a predetermined positive angular margin (+X) relative to the corresponding zero-crossing point.

The first determination signal DP1 having the high level enables the correction executor 81 to execute correction of each of the first and second level signals OUT1 and OUT2.

In contrast, the first correction determiner 82 is configured to output the first correction signal DP1 having the low level upon the phase θ of the AC voltage Vac being outside the correction enabling period PP1.

Figure 8A:
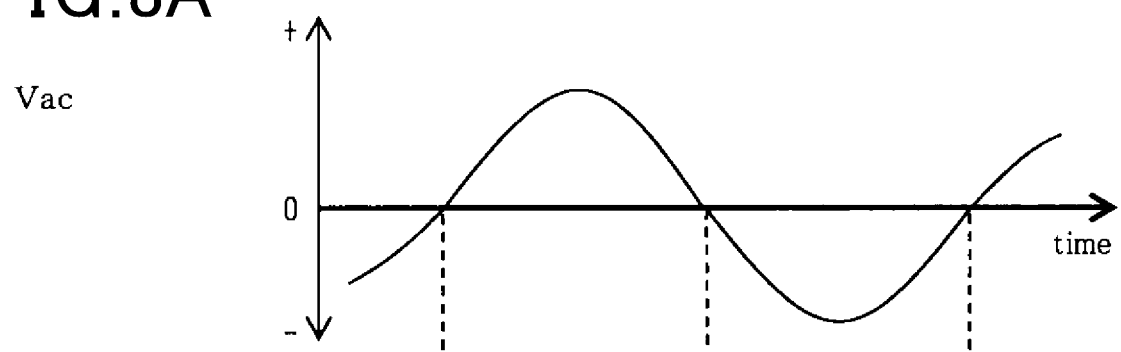
FIG. 8A is a graph schematically illustrating how the AC voltage is changed over time.
Figure 8B:
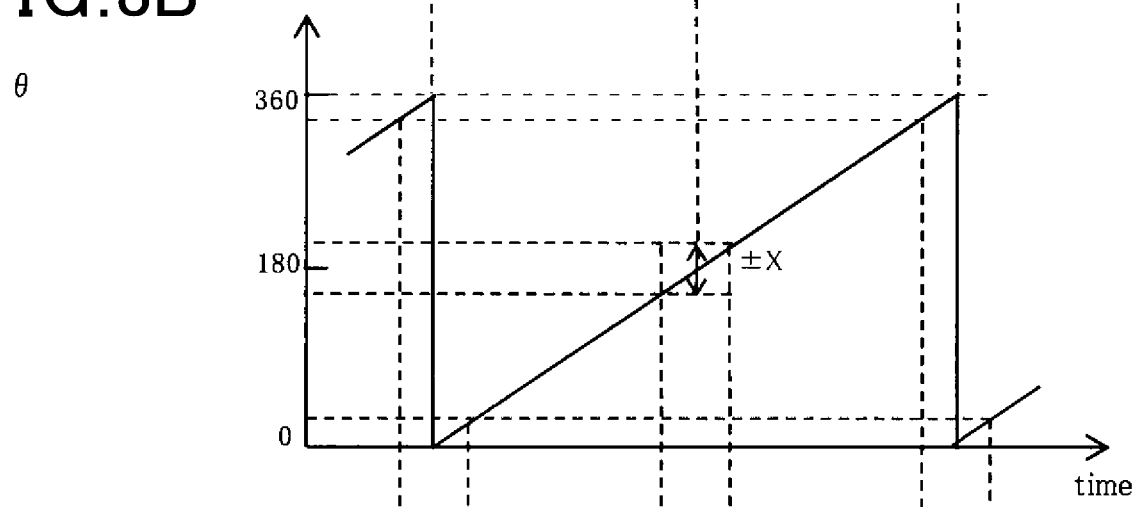
FIG. 8B is a graph schematically illustrating how the phase of the AC voltage is changed over time.
Figure 8C:
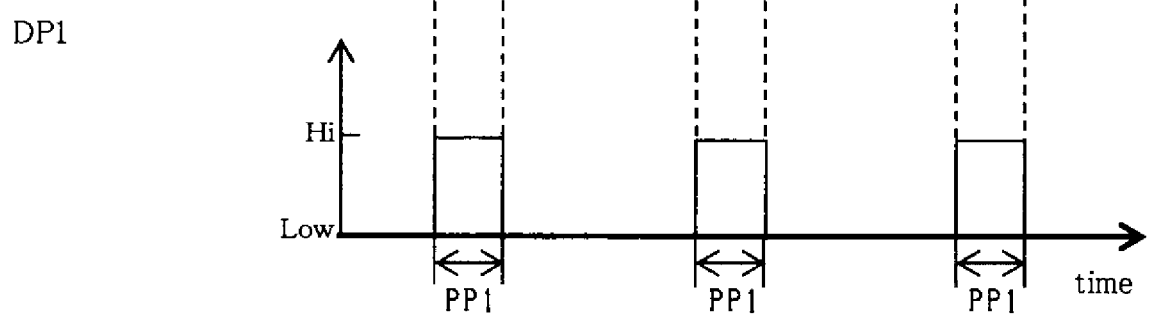
FIG. 8C is a graph schematically illustrating how a first determination signal is changed over time.

Next, the following describes the first determination signal DP1. FIG. 8A schematically illustrates how the AC voltage Vac is changed over time, FIG. 8B schematically illustrates how the phase θ of the AC voltage Vac is changed over time, and FIG. 8C schematically illustrates how the first determination signal DP1 is changed over time.

The first correction determiner 82 monitors the phase θ of the AC voltage Vac estimated by the phase estimator 31, and determines whether the monitored phase θ of the AC voltage Vac is within the enabling period PP1 for each of the zero-crossing points; the enabling period PP1 is expressed as "θ1−X1≤PP1≤θ1+X1".

Upon determining that the monitored phase θ of the output voltage Vac is within the enabling period PP1, the first correction determiner 82 sets the first determination signal DP1 to have the high level. The first determination signal DP1 having the high level enables the correction executor 81 to execute correction of each of the first and second level signals OUT1 and OUT2. Note that the reference phase θ1 for each of the zero-crossing points is set to a corresponding one of the 0 degrees, 180 degrees, and 360 degrees.

Otherwise, the monitored phase θ of the AC voltage Vac is outside the enabling period PP1, the first correction determiner 82 sets the first determination signal DP1 to have the low level. The first determination signal DP1 having the low level disables the correction executor 81 from executing correction of each of the first and second level signals OUT1 and OUT2.

The second correction determiner 83 is configured to output a second determination signal DP2, i.e. a pulse signal, having the high level upon the AC voltage Vac being within a predetermined correction enabling period PP2; the correction enabling period PP2 is set for each zero-crossing point such that the correction enabling period PP2 is defined as the range from a negative threshold voltage −TH3 inclusive to a positive threshold voltage +TH3; an absolute value of the threshold voltage TH3 is set to be smaller than the amplitude of the AC voltage Vac.

Figure 9A:
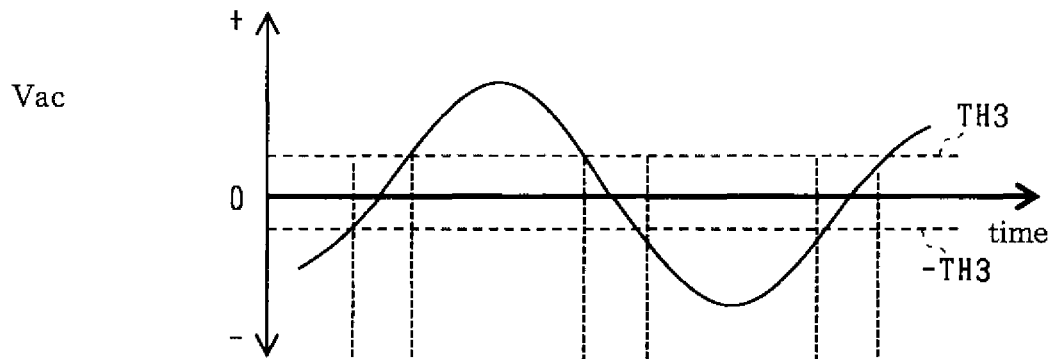
FIG. 9A is a graph schematically illustrating how the AC voltage is changed over time.
Figure 9B:
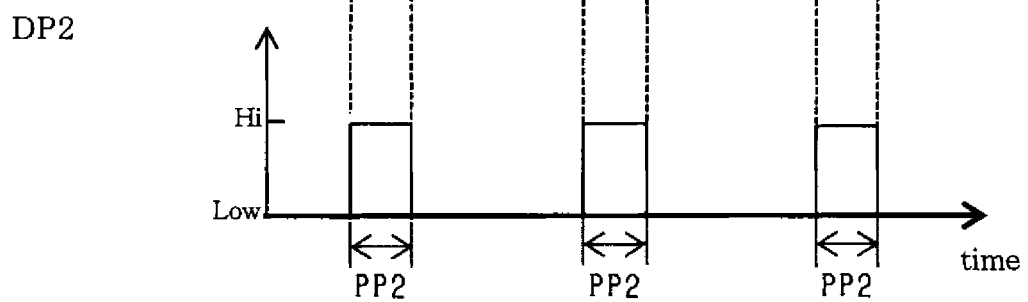
FIG. 9B is a graph schematically illustrating how a second determination signal is changed over time.

Next, the following describes the second determination signal DP2. FIG. 9A schematically illustrates how the AC voltage Vac is changed over time, and FIG. 9B schematically illustrates how the second determination signal DP2 is changed over time.

The second correction determiner 83 monitors the AC voltage Vac estimated by the phase estimator 31, and determines whether the monitored AC voltage Vac is within the correction enabling period PP2 defined as the range from the negative threshold voltage −TH3 inclusive to the positive threshold voltage +TH3 inclusive for each of the zero-crossing points.

Upon determining that the monitored AC voltage Vac is within the correction enabling period PP2, that is, the absolute value of the monitored AC voltage Vac is smaller than the threshold voltage TH3, the second correction determiner 83 sets the second determination signal DP2 to have the high level. The second determination signal DP2 having the high level enables the correction executor 81 to execute correction of each of the first and second level signals OUT1 and OUT2.

Otherwise, the monitored AC voltage Vac is outside the correction enabling period PP2, that is, the absolute value of the monitored AC voltage Vac is equal to or larger than the threshold voltage TH3, the second correction determiner 83 sets the second determination signal DP2 to have the low level. The second determination signal DP2 having the low level disables the correction executor 81 from executing correction of each of the first and second level signals OUT1 and OUT2.

The third correction determiner 84 is configured to output a third determination signal DP3, i.e. a pulse signal, having the high level upon an absolute of the output current Iac being smaller than a predetermined threshold current TH4.

The third determination signal DP3 having the high level enables the correction executor 81 to execute correction of each of the first and second level signals OUT1 and OUT2.

Next, the following describes the third determination signal DP3.

If an overcurrent is flowing in a portion of the power conversion system 100, which is closer to the first and second DC terminals TD1 and TD2 than the full-bridge circuit 12 is, an increase in the inductor current IL3 may cause an additional overcurrent to flow through the first and second AC terminals TA1 and TA2. This may result in inversion of the on/off level of each switch SW1 to SW4 being likely to reduce the output current Iac.

Figure 10A:
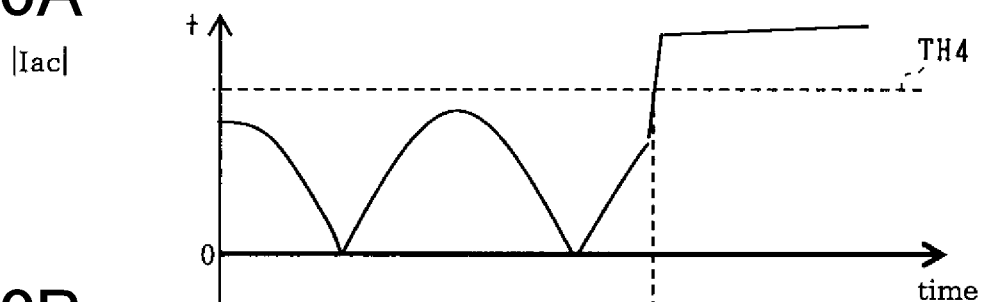
FIG. 10A is a graph schematically illustrating how the absolute of an output current is changed over time.
Figure 10B:
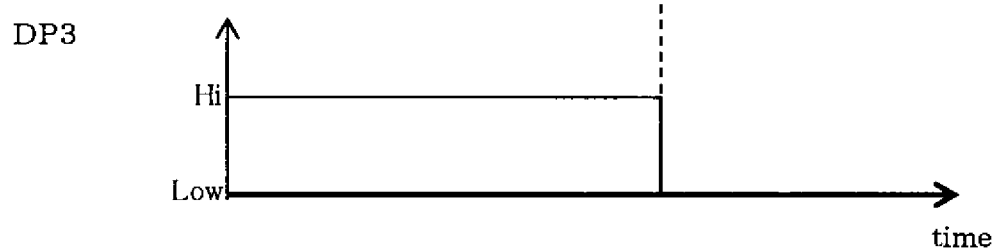
FIG. 10B is a graph schematically illustrating how a third determination signal is changed over time.

FIG. 10A schematically illustrates how the absolute of the output current Iac is changed over time, and FIG. 10B schematically illustrates how the third determination signal DP3 is changed over time.

The third correction determiner 84 monitors the absolute of the output current Iac, and determines whether the monitored absolute of the output current Iac is smaller than the threshold current TH4.

Upon determining that the monitored absolute of the output current Iac is smaller than the threshold current TH4, the third correction determiner 84 sets the third determination signal DP3 to have the high level. The third determination signal DP3 having the high level enables the correction executor 81 to execute correction of each of the first and second level signals OUT1 and OUT2.

Otherwise, upon determining that the monitored absolute of the output current Iac is equal to or larger than the threshold current TH4, the third correction determiner 84 determines that an overcurrent is flowing through the inductor 13. Then, the third correction determiner 84 sets the third determination signal DP3 to have the low level. The third determination signal DP3 having the low level disables the correction executor 81 from executing correction of each of the first and second level signals OUT1 and OUT2.

As illustrated in FIG. 2, the first level signal OUT1 sent from the polarity switching unit 55, the second level signal OUT2 sent from the inverter gate 359, the overcurrent determination signal DS sent from the overcurrent determiner 70, and the first to third determination signals DP1 to DP3 sent from the respective first to third correction determiners 82 to 84 are inputted to the correction executor 81.

The correction executor 81 is connected to the gates of the respective first to fourth switches SW1 to SW4. That is, the correction executor 81 outputs on-off control signals to the gates of the respective first to fourth switches SW1 to SW4 as the first to fourth gate signals GS1 to GS4.

The correction executor 81 is configured to operate in a first mode upon the overcurrent determination signal DS having the low level to thereby output the first to fourth gate signals GS1 to GS4 to the gates of the respective first to fourth switches SW1 to SW4 in accordance with the logical levels of the first and second level signals OUT1 and OUT2.

Specifically, the correction executor 81 operating in the first mode is configured to output (1) The first and fourth gate signals GS1 and GS4 each having the high level upon the first level signal OUT1 having the high level (2) The first and fourth gate signals GS1 and GS4 each having the low level upon the first level signal OUT1 having the low level (3) The second and third gate signals GS2 and GS3 each having the low level upon the second level signal OUT2 having the low level (4) The second and third gate signals GS2 and GS3 each having the high level upon the second level signal OUT2 having the high level The high level, i.e. the high voltage level, of each of the first to sixth gate signals GS1 to GS6 causes the corresponding one of the first to sixth switches SW1 to SW6 to be fully turned on. Each of the first to sixth switches SW1 to SW6 being in the full-on state represents that a gate voltage at the gate of the corresponding one of the first to switch switches SW1 to SW6 is equal to or higher than a corresponding threshold voltage, so that the on state is maintained while an on state resistance thereof is substantially zero.

Although the overcurrent determination signal DS has the high level, the correction executor 81 is configured to operate in the first mode to thereby output the first to fourth gate signals GS1 to GS4 to the gates of the respective first to fourth switches SW1 to SW4 in accordance with the logical levels of the first and second level signals OUT1 and OUT2 in the same manner as the first mode.

Additionally, the correction executor 81 is configured to operate in a second mode upon the overcurrent determination signal DS and each of the first to third determination signals DP1 to DP3 having the high level to thereby output the first to fourth gate signals GS1 to GS4 to the gates of the respective first to fourth switches SW1 to SW4 in accordance with the inverted logical levels of the first and second level signals OUT1 and OUT2.

Specifically, the correction executor 81 operating in the second mode is configured to output (1) The first and fourth gate signals GS1 and GS4 each having the low level upon the first level signal OUT1 having the high level (2) The first and fourth gate signals GS1 and GS4 each having the high level upon the first level signal OUT1 having the low level (3) The second and third gate signals GS2 and GS3 each having the high level upon the second level signal OUT2 having the low level (4) The second and third gate signals GS2 and GS3 each having the low level upon the second level signal OUT2 having the high level This enables the on/off level of the pair of the first and fourth switches SW1 to SW4 and the on/off level of the pair of the second and third switches SW2 and SW3 to be inverted upon the output current Iac being determined to be in the overcurrent state.

Figure 11:
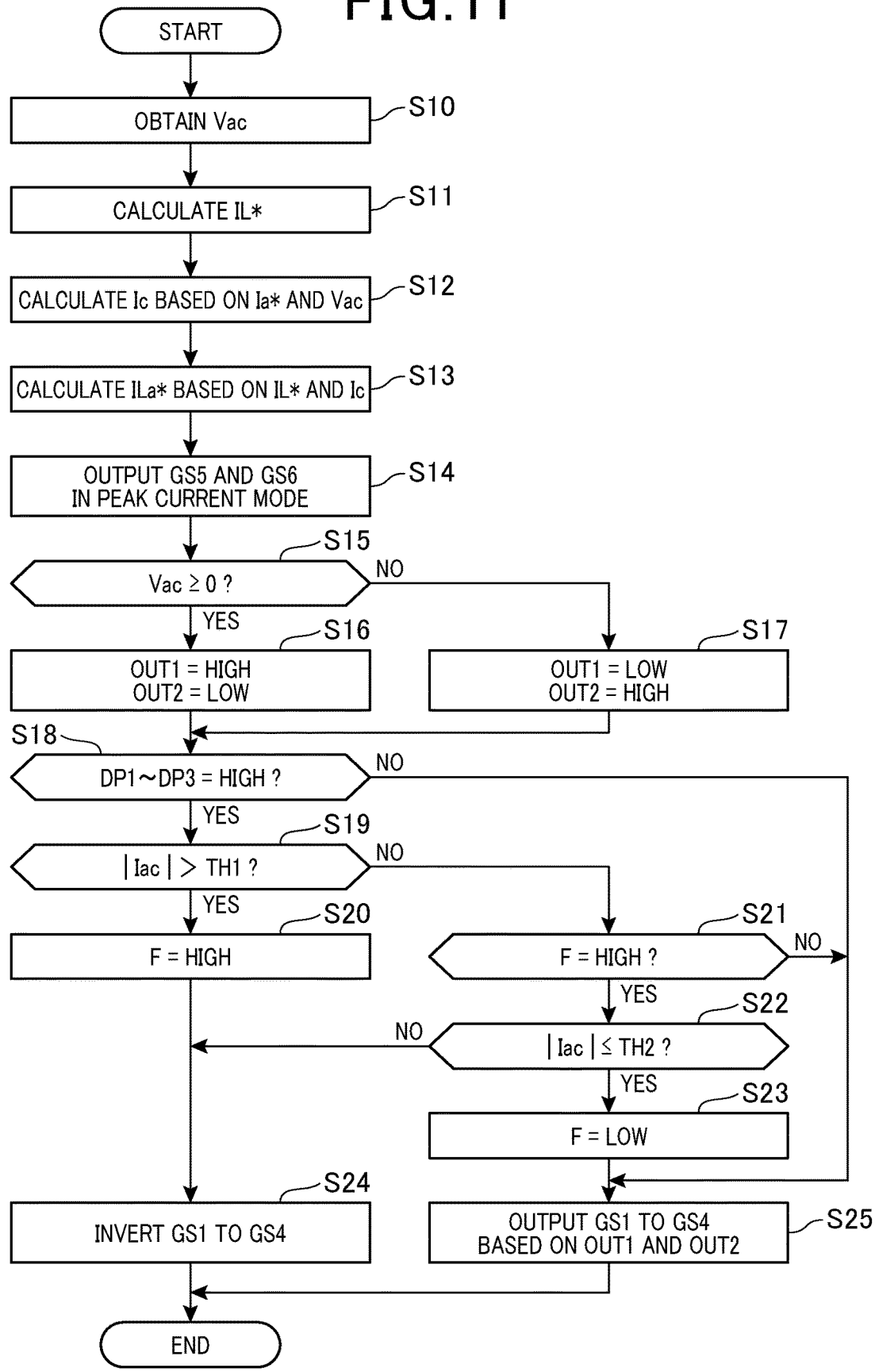
FIG. 11 is a flowchart schematically illustrating a switch control routine carried out by the control apparatus according to the first embodiment.

Next, the following describes a switch control routine carried out by the control apparatus 30 in the peak current mode every predetermined control period that corresponds to, for example, the switching cycle Tsw with reference to FIG. 11.

When starting a present cycle of the switch control routine, the control apparatus 30 serves as, for example, an AC voltage obtainer to obtain a value of the AC voltage Vac measured by the AC voltage sensor 23 in step S10, and obtains a value of the inductor current ILr measured by the inductor current sensor 22, and obtains a value of the AC voltage Vac measured by the AC voltage sensor 23 in step S11.

Then, the control apparatus 30 multiplies the amplitude command Ia* by the reference waveform sin θ to obtain the multiplication result Ia*×sin θ, and calculates the absolute value of the multiplication result Ia*×sin θ, thus calculating the pre-correction command current IL* in step S11.

Next, the control apparatus 30 serves as, for example, the current corrector 40 to set the current correction Ic as a function of the amplitude command Ia* and the RMS Vrms of the AC voltage Vac in step S12.

After setting of the current correction Ic, the control apparatus 30 adds the value of the current correction Ic to the pre-correction command current IL* to thereby set a value of the corrected command current ILa* in step S13.

Next, the control apparatus 30 generates and outputs the fifth and sixth gate signals GS5 and GS6 for the respective fifth and sixth switches SW5 and SW6 in the peak current mode in step S14.

Specifically, the control apparatus 30 serves as the current control unit 50 set forth above to thereby determine, based on the inductor current ILr and the corrected command current ILa*, the fifth and sixth gate signals GS5 and GS6 in the known peak current mode for the respective fifth and sixth switches SW5 and SW6 in the peak current mode in step S14. Then, the control apparatus 30 applies the fifth and sixth gate signals GS5 and GS6 to the respective fifth and sixth switches SW5 and SW6, thus controlling on-off switching operations of the respective fifth and sixth switches SW5 and SW6 in step S14.

Following the operation in step S14, the control apparatus 30 determines whether the AC voltage Vac has the positive polarity, which is expressed by "Vac≥0" in step S15.

Upon determining that the AC voltage Vac has the positive polarity (YES in step S15), the control apparatus 30 serves as, for example, the polarity switching unit 55 and the inverter gate 40 to set the first level signal OUT1 to have the high level, and set the second level signal OUT2 to have the low level in step S16.

Otherwise, upon determining that the AC voltage Vac has the negative polarity (NO in step S15), the control apparatus 30 serves as, for example, the polarity switching unit 55 and the inverter gate 40 to set the first level signal OUT1 to have the low level, and set the second level signal OUT2 to have the high level in step S17.

After the operation in step S16 or step S17, the switch control routine proceeds to step S18.

In step S18, the control apparatus 30 serves as, for example, the controller 80 to thereby perform a correction determination task for the first and second level signals OUT1 and OUT2.

Specifically, the control apparatus 30 determines whether all the first to third determination signals DS1 to DS3 have the high level in step S18.

Upon determining that all the first to third determination signals DS1 to DS3 have the high level, the control apparatus 30 enables correction of the first and second output signals OUT1 and OUT2 (YES in step S18). Then, the switch control routine proceeds to step S19.

Otherwise, upon determining that at least one of the first to third determination signals DS1 to DS3 has the low level, the control apparatus 30 disables correction of the first and second output signals OUT1 and OUT2 (NO in step S18). Then, the switch control routine proceeds to step S25.

In step S25, the control apparatus 30 serves as, for example, the controller 80 to output the first to fourth gate signals GS1 to GS4 to the gates of the respective first to fourth switches SW1 to SW4 in accordance with the logical levels of the first and second level signals OUT1 and OUT2.

Specifically, in step S25, the control apparats 30 is programmed to

1. Output, to the respective first and fourth switches SW1 and SW4, the first and fourth gate signals GS1 and GS4 each having the logical level that is the same as the logical level of the first level signal OUT1

2. Output, to the respective second and third switches SW2 and SW3, the second and third gate signals GS2 and GS3 each having the logical level that is the same as the logical level of the second level signal OUT2

After completion of the operation in step S25, the control apparatus 30 terminates the present cycle of the switch control routine, and thereafter performs the next cycle of the switch control routine.

On the other hand, following the affirmative determination in step S18, the control apparatus 30 serves as, for example, the overcurrent determiner 70 to determine whether the absolute value of the output current Iac is larger than the overcurrent threshold TH1 in step S19.

Upon determining that the absolute value of the output current Iac is larger than the overcurrent threshold TH1 (YES in step S19), the control apparatus 30 sets or holds a previously prepared overcurrent determination flag F to a logical high level, i.e. 1 in step S20.

Note that the overcurrent determination flag F is, for example, a bit having a logical high level, represented by 1, or a logical low level, represented by 0, and the initial value of the overcurrent determination flag F is set to 0.

After the operation in step S20, the switch control routine proceeds to step S24.

In step S24, the control apparatus 30 serves as, for example, the controller 80 to invert the logical level of each of the first and second level signals OUT1 and OUT2.

Specifically, the control apparatus 30 changes the high level of the first level signal OUT1 set in step S16 to the low level, and changes the low level of the second level signal OUT2 set in step S16 to the high level upon the output current Iac having the positive polarity. In addition, the control apparatus 30 changes the low level of the first level signal OUT1 set in step S17 to the high level, and changes the high level of the second level signal OUT2 set in step S17 to the low level upon the output current Iac having the negative polarity.

This enables each of the first and fourth gate signals GS1 and GS4 determined based on the first level signal OUT1 to be logically inverted, and each of the second and third gate signals GS2 and GS3 deter mined based on the second level signal OUT2 to be logically inverted. After completion of the operation in step S24, the control apparatus 30 terminates the present cycle of the switch control routine, and thereafter performs the next cycle of the switch control routine.

Otherwise, upon determining that the absolute value of the output current Iac is equal to or smaller than the overcurrent threshold TH1 (NO in step S19), the control apparatus 30 determines whether the overcurrent determination flag F is set to 1, i.e. the logical high level in step S21.

Upon determining that the overcurrent determination flag F is set to 0, i.e. not set to 1 (NO in step S21), the control apparatus 30 carries out the operation in step S25. Thereafter, the control apparatus 30 terminates the switch control routine, and thereafter performs the next cycle of the switch control routine.

Otherwise, upon determining that the overcurrent determination flag F is set to 1 (YES in step S21), the control apparatus 30 determines whether the overcurrent state of the output current Iac has recovered to a normal state in step S22. Specifically, the control apparatus 30 determines whether the absolute value of the output current Iac is equal to or smaller than the recovery threshold TH2 in step S22.

Upon determining that the absolute value of the output current Iac is larger than the recovery threshold TH2 (NO in step S22), the control apparatus 30 determines that the overcurrent state of the output current Iac has not recovered to the normal state, i.e. has been continued, thus executing the operation in step S25. Thereafter, the control apparatus 30 terminates the switch control routine, and thereafter performs the next cycle of the switch control routine.

Otherwise, upon determining that the absolute value of the output current Iac is equal to or smaller than the recovery threshold TH2 (YES in step S22), the control apparatus 30 determines that the overcurrent state of the output current Iac has recovered to the normal state, i.e. has been terminated. Then, the control apparatus 30 sets the overcurrent determination flag F to 0, i.e. the logical low level in step S23, and executes the operation in step S25. Thereafter, the control apparatus 30 terminates the switch control routine, and thereafter performs the next cycle of the switch control routine.

Next, the following describes how the control apparatus 30 works with reference to FIGS. 12A to 12D.

Figure 12A:
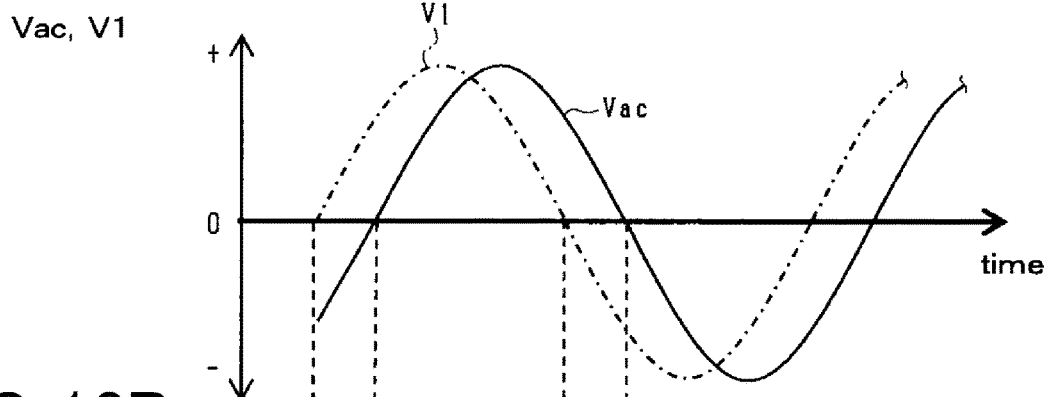
FIGS. 12A to 12D are a joint timing chart schematically illustrating how the control apparatus works according to the first embodiment.
Figure 12B:
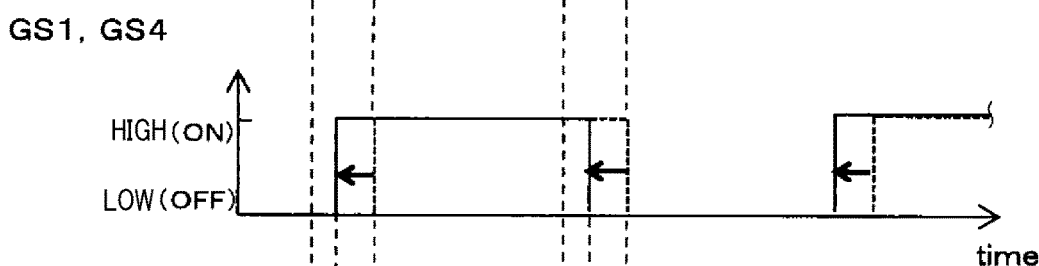
Figure 12C:
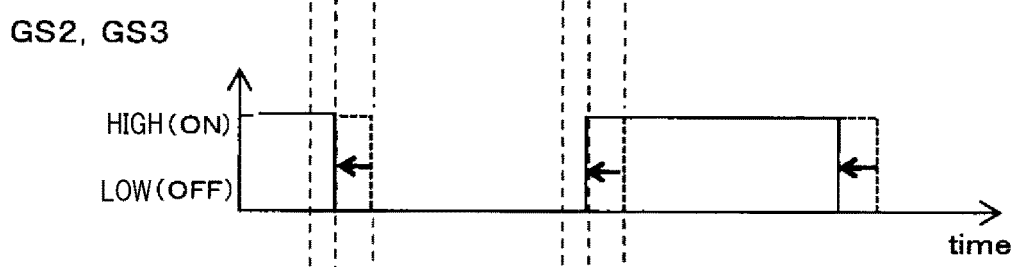
Figure 12D:
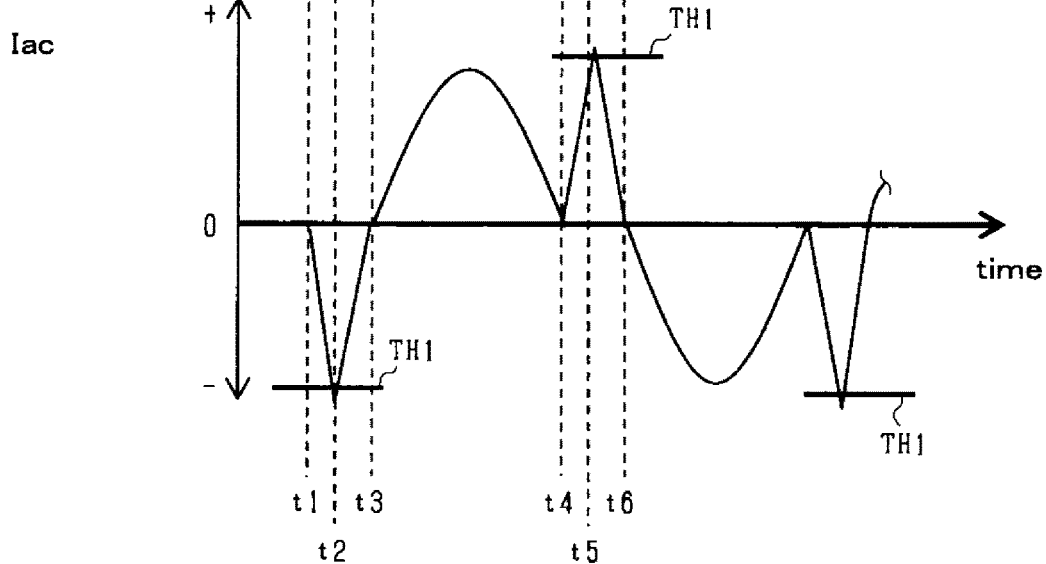

FIG. 12A schematically illustrates how the AC voltage Vac and the actual AC voltage V1 are changed over time, and FIG. 12B schematically illustrates how each of the first and fourth gate signals GS1 and GS4 is changed over time. FIG. 12C schematically illustrates how each of the second and third gate signals GS2 and GS3 is changed over time, and FIG. 12D schematically illustrates how the output current Iac is changed over time.

A phase difference between the AC voltage Vac and the actual AC voltage V1 causes a period during which the actual voltage V1 has the positive polarity but the AC voltage Vac has the negative polarity after time t1 (see a period from the time t1 to time t2 in FIG. 12A). This generates a bypass circuit in the full-bridge circuit 12, so that the absolute of a negative value of the output current Iac flowing through the first and second AC terminals TA1 and TA2 increases.

At that time, when the absolute of the negative value of the output current Iac exceeds the overcurrent threshold TH1 at time t2 (see YES in step S19), the control apparatus 30 switches the low level of each of the first and fourth gate signals GS1 and GS4 to the high level, and switches the high level of each of the second and third gate signals GS2 and GS3 to the low level (see the operation in step S24).

The turn-off of the third switch SW3 interrupts the first negative-current bypass circuit for the negative value of the output current Iac (see FIGS. 6B and 12B) to thereby reduce the absolute of the negative value of the output current Iac. The turn-off of the second switch SW2 interrupts the second negative-current bypass circuit for the negative value of the output current Iac (see FIGS. 6B and 12B) to thereby reduce the absolute of the negative value of the output current Iac.

This recovers the overcurrent state of the output current Iac through the first and second AC terminals TA1 and TA2 to the normal state.

When the AC voltage Vac passes through a zero-crossing point so that the AC voltage Vac is changed from the negative polarity to the positive polarity at time t3, the polarity of the AC voltage Vac and the polarity of the actual AC voltage V1 match between each other. This prevents the negative output current Iac from flowing through the bypass circuit, resulting in the positive output current Iac flowing through the first and second AC terminals TA1 and TA2 during both the actual AC voltage V1 and the AC voltage Vac having the positive polarity.

Thereafter, when the actual voltage V1 passes through a zero-crossing point so that the AC voltage Vac is changed from the positive polarity to the negative polarity at time t4, the polarity of the AC voltage Vac and the polarity of the actual AC voltage V1 becomes mismatched between each other. This generates a bypass circuit in the full-bridge circuit 12, so that the absolute of a positive value of the output current Iac flowing through the first and second AC terminals TA1 and TA2 increases.

At that time, when the absolute value of the output current Iac exceeds the overcurrent threshold TH1 at time t5 (see YES in step S19), the control apparatus 30 switches the high level of each of the first and fourth gate signals GS1 and GS4 to the low level, and switches the low level of each of the second and third gate signals GS2 and GS3 to the high level (see the operation in step S24).

The turn-off of the first switch SW1 interrupts the first positive-current bypass circuit for the positive value of the output current Iac (see FIGS. 6A and 12A) to thereby reduce the absolute value of the output current Iac. The turn-off of the fourth switch SW4 interrupts the second positive-current bypass circuit for the positive value of the output current Iac (see FIGS. 6A and 12A) to thereby reduce the absolute value of the output current Iac.

This recovers the overcurrent state of the output current Iac through the first and second AC terminals TA1 and TA2 to the normal state.

Thereafter, when the AC voltage Vac passes through a zero-crossing point so that the AC voltage Vac is changed from the positive polarity to the negative polarity at time t6, the polarity of the AC voltage Vac and the polarity of the actual AC voltage V1 match between each other. This prevents the positive output current Iac from flowing through the bypass circuit, resulting in the negative output current Iac flowing through the first and second AC terminals TA1 and TA2 during both the actual AC voltage V1 and the AC voltage Vac having the negative polarity.

Figure 13:
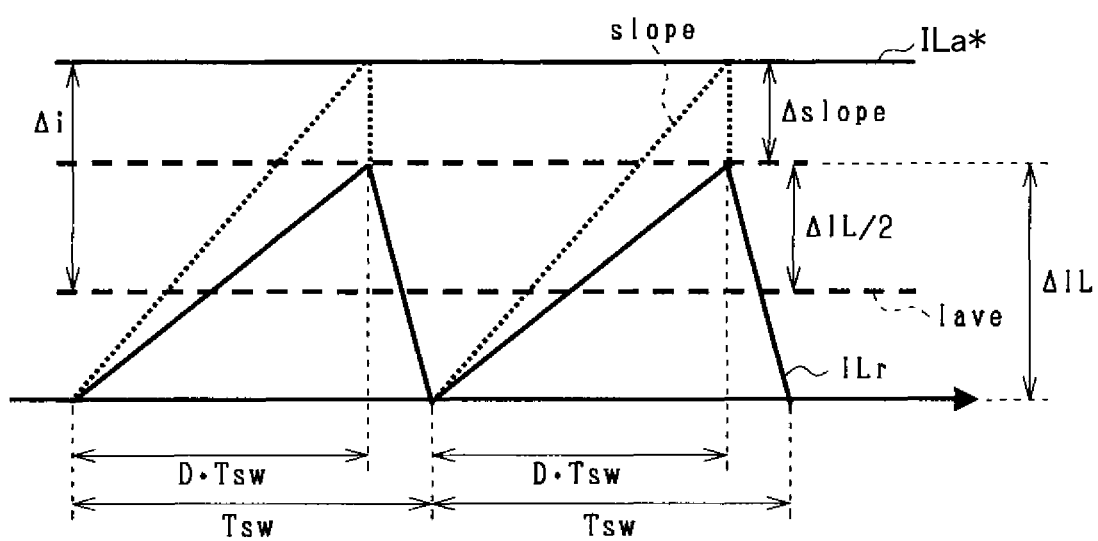
FIG. 13 is a graph schematically illustrating how to create a reference correction map.

Next, the following describes how to create the reference correction map M2 with reference to FIG. 13. Note that, in FIG. 13, reference character D shows the duty factor of the fifth switch SW5.

The first embodiment defines the deviation range parameter $\Delta i$ as a parameter indicative of a subtraction of the average Iave of the inductor current ILr from the pre-correction command current IL*.

For this reason, the deviation range parameter $\Delta i$ relative to the average Iave of the inductor current ILr is represented, for each switching cycle Tsw, as the sum of half of a maximum inductor-current increment $\Delta IL$ of the inductor current ILr during the on period ($D \times Tsw$), which is referred to as ($\Delta IL/2$), and a maximum slope-signal increment $\Delta Slope$ (see FIG. 13). The maximum inductor-current increment $\Delta IL$ represents a maximum increment of the inductor current ILr for each switching cycle Tsw, and the slope-signal increment $\Delta Slope$ represents a maximum increment of the slope compensation signal Slope.

This therefore enables the deviation range parameter $\Delta i$ to be calculated in accordance with the following equation (2):

$$\Delta i = ILa^* - \text{Iave} = \Delta\text{slope} + \Delta IL/2 \quad (2)$$

In addition, the maximum inductor-current increment $\Delta IL$ can be calculated in accordance with the following equation (3):

$$\Delta IL = \frac{\text{Vdc} - \sqrt{2}\,\text{Vrms}\cdot|\sin\theta|}{L} \cdot D \cdot T_{SW} \quad (3)$$

where the value expressed by the equation (Vdc−$\sqrt{2}$Vrms·|sin θ|) represents the voltage across the inductor 13.

Additionally, the slope-signal increment $\Delta$Slope representing the maximum increment of the slope compensation signal Slope can be calculated in accordance with the following equation (4):

$$\Delta\text{slope} = ms \times D \times T_{SW} \quad (4)$$

For example, an average value of the slope ms of the slope compensation signal Slope can be used as a value of the slope ms in calculating the deviation range parameter $\Delta i$.

The duty factor D of the of the fifth switch SW5 can be calculated in accordance with the following equation (5):

$$D = \frac{\text{Vdc} - \sqrt{2}\,\text{Vrms}\cdot|\sin\theta|}{\text{Vdc}} \quad (5)$$

Assigning the equation (3) and the equation (4), to which the equation (5) has been assigned, to the equation (2) enables the deviation range parameter $\Delta i$ to be expressed by the above equation (1).

The first embodiment calculates the reference correction Ih using the deviation range parameter $\Delta i$. For example, the first embodiment uses a product of the deviation range parameter $\Delta i$ and a predetermined calculation coefficient $\alpha$ as the reference correction Ih; the calculation coefficient $\alpha$ can be set to is a value more than 0 and equal to or less than 1. Storing, in the memory 30b, calculated values of the reference correction Ih such that the calculated values of the reference correction Ih correlate with the respective values of the RMS Vrms enables the reference correction map M2 to be created in the memory 30b.

As described above, the control apparatus 30 of the first embodiment is configured to determine whether the output current Iac flowing through the first and second AC terminals TA1 and TA2 is in the overcurrent state.

Upon determining that the output current Iac flowing through the first and second AC terminals TA1 and TA2 is in the overcurrent state, the control apparatus 30 is configured to invert the on/off state of each of the first to fourth switches SW1 to SW4.

This configuration reduces, even if there is a phase difference between the actual AC voltage V1 and the AC voltage Vac due to, for example, rapid voltage change in the AC power source 200 and/or measurement errors of the AC voltage sensor 23, the flow of an overcurrent through the first and second AC terminals TA1 and TA2 as the output current Iac.

The control apparatus 30 is also configured not to invert the on/off state of each of the first to fourth switches SW1 to SW4 upon determining that there is no phase difference between the actual AC voltage V1 and the AC voltage Vac.

Upon determining that the output current Iac flowing through the first and second AC terminals TA1 and TA2 is in the overcurrent state, the control apparatus 30 is configured to change (1) The on state of one of the first pair of the first and fourth switches SW1 and SW4 and the second pair of the second and third switches SW2 and SW3 to the off state (2) The off state of the other of the first pair of the first and fourth switches SW1 and SW4 and the second pair of the second and third switches SW2 and SW3 to the on state This reduces both the deviation of the on/off timing of the first pair of the first and fourth switches SW1 and SW4 relative to the corresponding zero-crossing point of the actual AC voltage V1, and the deviation of the on/off timing of the second pair of the second and third switches SW2 and SW3 relative to the corresponding zero-crossing point of the actual AC voltage V1. This reliably reduces the flow of an overcurrent through the first and second AC terminals TA1 and TA2 as the output current Iac.

The control apparatus 30 is further configured to determine whether the absolute value of the output current Iac is larger than the overcurrent threshold TH1, and determine that the output current Iac is in the overcurrent state upon determining that the absolute value of the output current Iac is larger than the overcurrent threshold TH1.

Thereafter, the control apparatus 30 is configured to determine whether the absolute value of the output current Iac is equal to or smaller than the recovery threshold TH2, which is set to be smaller than the overcurrent threshold TH1, and determine that that the output current Iac has recovered to the normal state upon determining that the absolute value of the output current Iac is equal to or smaller than the recovery threshold TH2.

This configuration prevents, if the output current Iac, which has been determined to be in the overcurrent state, decreases to be smaller than the recovery threshold TH2, the output current Iac from being determined to be in the overcurrent state again. This prevents unnecessary changes of the on/off state of each of the first to fourth switches SW1 to SW4.

Additionally, the control apparatus 30 is configured to invert the on/off state of each of the first to fourth switches SW1 to SW4 on condition that the first determination signal DP1 has the high level, that is, the monitored phase θ of the AC voltage Vac is within the enabling period PP1 close to a corresponding zero-crossing point.

This configuration prevents erroneous determination of inverting the on/off state of each of the first to fourth switches SW1 to SW4 due to noise while reducing the flow of an overcurrent through the first and second AC terminals TA1 and TA2 as the output current Iac.

The control apparatus 30 is configured to invert the on/off state of each of the first to fourth switches SW1 to SW4 on condition that the second determination signal DP2 has the high level, that is, the absolute value of the monitored AC voltage Vac is smaller than the threshold voltage TH3.

This configuration prevents erroneous determination of inverting the on/off state of each of the first to fourth switches SW1 to SW4 due to noise while reducing the flow of an overcurrent through the first and second AC terminals TA1 and TA2 as the output current Iac.

Moreover, the control apparatus 30 is configured to invert the on/off state of each of the first to fourth switches SW1 to SW4 on condition that the third determination signal DP3 has the high level, that is, the absolute value of the output current Iac is smaller than the threshold current TH4.

This configuration reduces the flow of an overcurrent through the first and second AC terminals TA1 and TA2 as the output current Iac due to only rapid voltage change in the AC power source 200 and/or measurement errors of the AC voltage sensor 23.

First Modification of the First Embodiment

The control apparatus 30 of the first modification can be configured to perform the determination in step S18 after the affirmative determination in step S19. This configuration is capable of preventing unnecessary changes of the on/off state of each of the first to fourth switches SW1 to SW4 even if it is erroneously determined that the output current Iac is in the overcurrent state.

Second Modification of the First Embodiment

Upon determining that the output current Iac flowing through the first and second AC terminals TA1 and TA2 is in the overcurrent state, the control apparatus 30 can be configured to change only the on state of one of the first pair of the first and fourth switches SW1 and SW4 and the second pair of the second and third switches SW2 and SW3 to the off state.

For example, this configuration of the second modification interrupts each of the first and second positive-current closed circuits (see FIG. 6A) for the positive value of the output current Iac. This also reduces the flow of an overcurrent through the first and second AC terminals TA1 and TA2 as the output current Iac, thus reducing the overcurrent state of the output current Iac.

Second Embodiment

Figure 14:
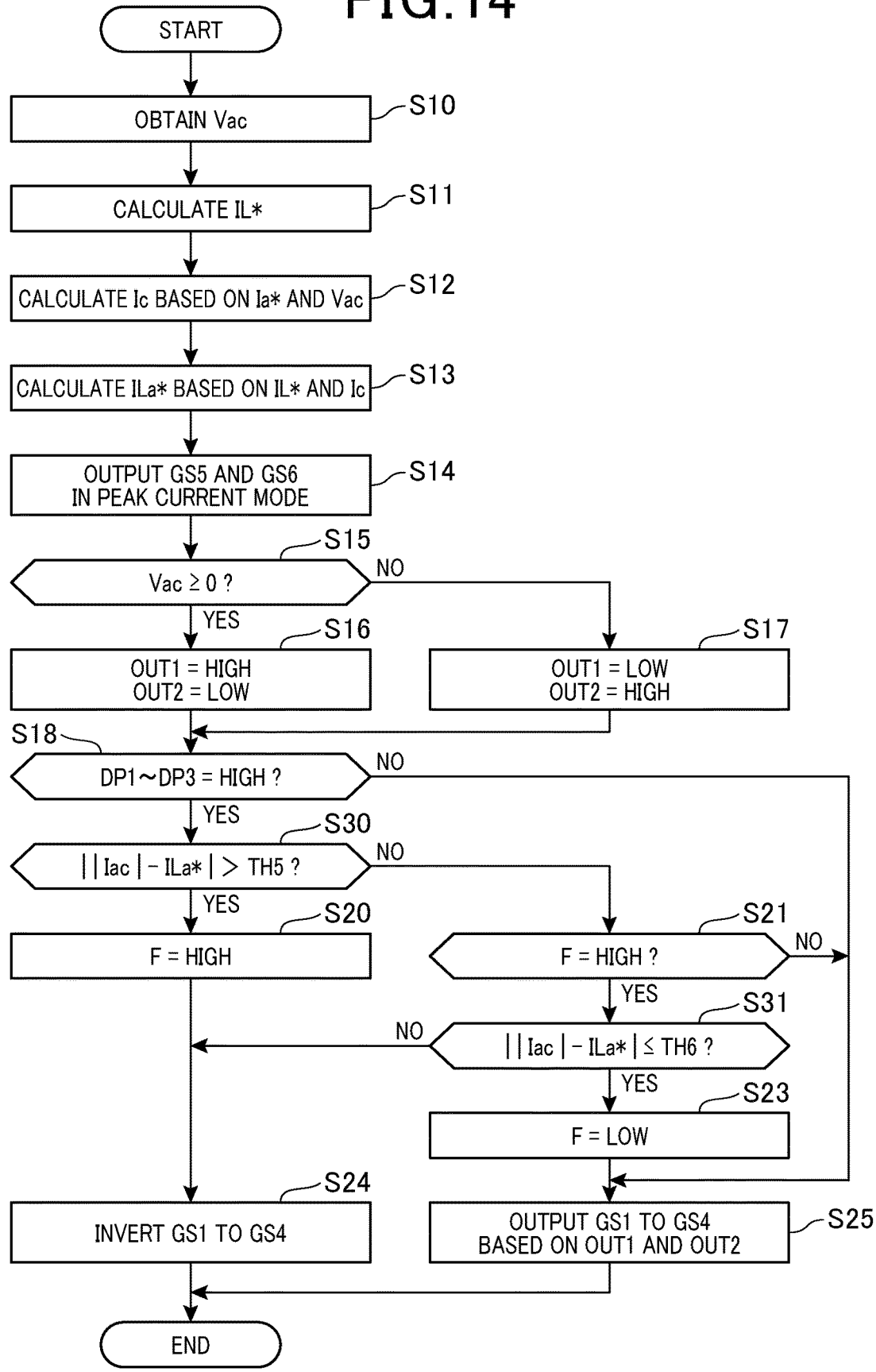
FIG. 14 is a flowchart schematically illustrating a switch control routine carried out by the control apparatus according to the second embodiment of the present disclosure.

The following describes the second embodiment of the present disclosure with reference to FIG. 14. The structures and/or functions of the power converter system 100 according to the second embodiment are different from those of the power converter system 100 according to the first embodiment in the following points. So, the following mainly describes the different points, and omits or simplifies descriptions of like parts between the first and second embodiments, to which identical or like reference characters are assigned, thus eliminating redundant description.

The control apparatus 30 is configured to control the fifth and sixth switches SW5 and SW6 in the peak current mode to thereby adjust the inductor current ILr to the corrected command current ILa*. This results in the output current Iac based on the corrected command current ILa* flowing through the first and second AC terminals TA1 and TA2. For this reason, if the output current Iac is not in the overcurrent state, i.e. is in the normal state, the deviation between the output current Iac and the command current ILa* becomes relatively smaller. Otherwise, if the output current Iac is in the overcurrent state, the deviation between the output current Iac and the command current ILa* becomes relatively larger.

From this viewpoint, the overcurrent deter miner 70 is configured to calculate a difference between the absolute value of the output current Iac and the corrected command current ILa*, and determine whether an absolute value of the difference between the absolute value of the output current Iac and the corrected command current ILa* is larger than a deviation threshold TH5. Upon determining that the absolute value of the difference between the absolute value of the output current Iac and the corrected command current ILa* is larger than the deviation threshold TH5, the overcurrent deter miner 70 is configured to determine that the output current Iac is in the overcurrent state.

Next, the following describes a switch control routine carried out by the control apparatus 30 according to the second embodiment every predetermined control period that corresponds to, for example, the switching cycle Tsw with reference to FIG. 14. Like steps between the switch control routines illustrated in respective FIGS. 11 and 14, to which like step numbers are assigned, are omitted or simplified in description.

Upon determining that all the first to third determination signals DS1 to DS3 have the high level, the control apparatus 30 enables correction of the first and second output signals OUT1 and OUT2 (YES in step S18). Then, the switch control routine proceeds to step S30.

In step S30, the control apparatus 30 serves as, for example, the overcurrent determiner 70 to calculate the difference between the absolute value of the output current Iac and the corrected command current ILa*, and determine whether the absolute value of the difference between the absolute value of the output current Iac and the corrected command current ILa* is larger than the deviation threshold TH5.

Upon determining that the absolute value of the difference between the absolute value of the output current Iac and the corrected command current ILa* is larger than the deviation threshold TH5 (YES in step S30), the control apparatus 30 determines that the output current Iac is in the overcurrent state, and sets or holds the overcurrent determination flag F to the logical high level, i.e. 1 in step S20.

Otherwise, upon determining that the absolute value of the difference between the absolute value of the output current Iac and the corrected command current ILa* is equal to or smaller than the deviation threshold TH5 (NO in step S30), the control apparatus 30 determines whether the overcurrent determination flag F is set to 1, i.e. the logical high level in step S21.

Like the first embodiment, the second embodiment defines, based on a hysteresis of the output current Iac, a recovery condition for determining whether the overcurrent state of the output current Iac has recovered to be in the normal state after the output current Iac has been deter mined to be in the overcurrent state.

Specifically, upon determining that the overcurrent determination flag F is set to 1 (YES in step S21), the control apparatus 30 determines whether the absolute value of the difference between the absolute value of the output current Iac and the corrected command current ILa* is equal to or smaller than a recovery threshold TH6, which is set to be smaller than the deviation threshold TH5, in step S31.

Upon determining that the absolute value of the difference between the absolute value of the output current Iac and the corrected command current ILa* is larger than the recovery threshold TH6 (NO in step S31), the control apparatus 30 determines that the overcurrent state of the output current Iac is not recovered to the normal state, i.e. has been continued, thus executing the operation in step S25.

Otherwise, upon determining that the absolute value of the difference between the absolute value of the output current Iac and the corrected command current ILa* is equal to or smaller than the recovery threshold TH6 (YES in step S31), the control apparatus 30 determines that the overcurrent state of the output current Iac has recovered to the normal state, i.e. has been terminated. Then, the control apparatus 30 sets the overcurrent determination flag F to 0, i.e. the logical low level in step S23.

As described above, the control apparatus 30 of the second embodiment is configured to determine whether the output current Iac is in the overcurrent state based on the corrected command current ILa*. This configuration makes it possible to determine whether the output current Iac is in the overcurrent state with high accuracy even if the output current Iac has a relatively low value. The other effects achieved by the control apparatus 30 of the second embodiment are substantially identical to the effects achieved by the control apparatus 30 of the first embodiment, and therefore, descriptions of which are omitted.

Third Embodiment

Figure 15:
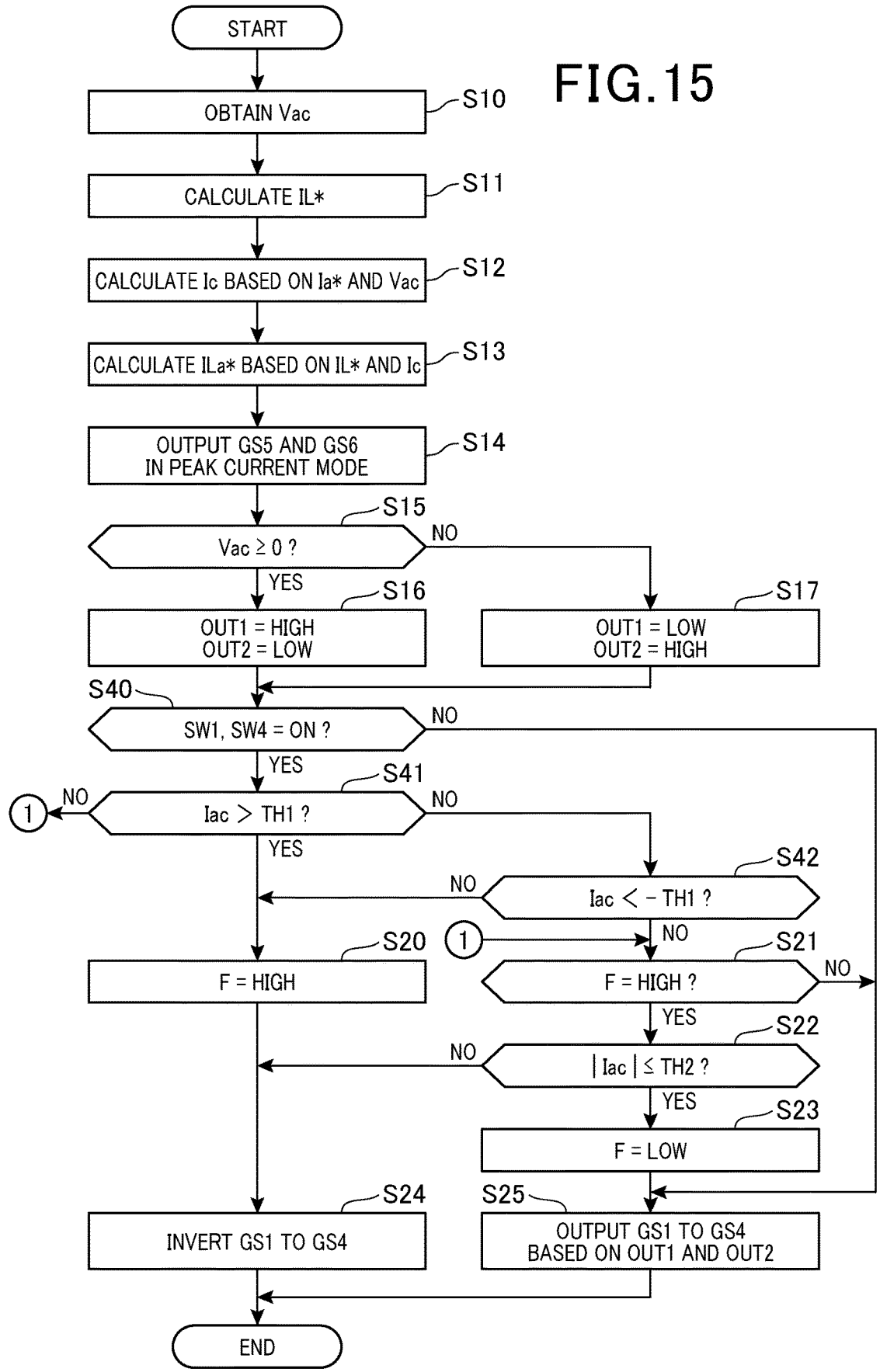
FIG. 15 is a flowchart schematically illustrating a switch control routine carried out by the control apparatus according to the third embodiment of the present disclosure.

The following describes the third embodiment of the present disclosure with reference to FIG. 15. The structures and/or functions of the power converter system 100 according to the third embodiment are different from those of the power converter system 100 according to the first embodiment in the following points. So, the following mainly describes the different points, and omits or simplifies descriptions of like parts between the first and third embodiments, to which identical or like reference characters are assigned, thus eliminating redundant description.

In the power converter system 100, the positive output current Iac flows for the period during which the first pair of the first and fourth switches SW1 and SW4 are controlled to be on, and the negative output current Iac flows for the period during which the second pair of the second and third switches SW2 and SW3 are controlled to be on.

From this viewpoint, upon determining that the first and fourth switches SW1 and SW4 are controlled to be on during the output current Iac being determined to be in the positive overcurrent state, the control apparatus 100 of the third embodiment is configured to invert the on state of each of the first and fourth switches SW1 and SW4 to the off state.

In addition, upon determining that the second and third switches SW2 and SW3 are controlled to be on during the output current Iac being determined to be in the negative overcurrent state, the control apparatus 100 of the third embodiment is configured to invert the on state of each of the second and third switches SW2 and SW3 to the off state.

The positive overcurrent state represents that an overcurrent flows from the first AC terminal TA1 to the second AC terminal TA2 via the AC power source 200 as the output current Iac, and the negative overcurrent state represents that an overcurrent flows from the second AC terminal TA2 to the first AC terminal TA1 via the AC power source 200 as the output current Iac.

Next, the following describes a switch control routine carried out by the control apparatus 30 according to the third embodiment every predetermined control period that corresponds to, for example, the switching cycle Tsw with reference to FIG. 15. Like steps between the switch control routines illustrated in respective FIGS. 11 and 15, to which like step numbers are assigned, are omitted or simplified in description. The switch control routine of the third embodiment includes operations in steps S40 to S43 in place of the operations in steps S18 and S19.

After the operation in step S16 or step S17 for setting each of the first and second level signals OUT1 and OUT2 to one of the high level and low level based on the polarity of the AC voltage Vac, the switch control routine proceeds to step S18.

In step S18, the control apparatus 30 determines whether the present period is the first period P1 during which each of the first and fourth switches SW1 and SW4 is in the on state in step S40. For example, the control apparatus 30 determines that the present period is the first period P1 during which each of the first and fourth switches SW1 and SW4 is controlled to be on in step S40. Otherwise, the control apparatus 30 determines that the present period is the second period P2 during which each of the first and fourth switches SW1 and SW4 is controlled to be off in step S40.

Upon determining that the present period is the first period P1 during which each of the first and fourth switches SW1 and SW4 is controlled to be on (YES in step S40), the control apparatus 30 determines whether the output current Iac is in the positive overcurrent state in step S41.

Specifically, the control apparatus 30 determines whether the value of the output current Iac is larger than the overcurrent threshold TH1, and determines that the output current Iac is in the positive overcurrent state upon determining that the value of the output current Iac is larger than the overcurrent threshold TH1 (YES in step S41). Then, the control apparatus 30 sets or holds the overcurrent determination flag F to the logical high level, i.e. 1 in step S20.

Otherwise, the control apparatus 30 determines that the output current Iac is not in the positive overcurrent state upon determining that the value of the output current Iac is equal to or smaller than the overcurrent threshold TH1 (NO in step S41). Then, the control apparatus 30 determines whether the overcurrent determination flag F is set to 1, i.e. the logical high level in step S21.

Otherwise, upon determining that the present period is not the first period P1 during which each of the first and fourth switches SW1 and SW4 is controlled to be on (NO in step S40), the control apparatus 30 determines that the present period is the second period P2 during which each of the second and third switches SW2 and SW3 is in the on state.

Then, the control apparatus 30 determines whether the output current Iac is in the negative overcurrent state in step S42.

Specifically, the control apparatus 30 determines whether the value of the output current Iac is less than, i.e. more negative than, a negative value −TH1 whose absolute value is identical to the overcurrent threshold TH1, and determines that the output current Iac is in the negative overcurrent state upon determining that the value of the output current Iac is smaller than the negative value −TH1 (YES in step S42). Then, the control apparatus 30 determines whether the overcurrent determination flag F is set to 1, i.e. the logical high level in step S21.

As described above, the control apparatus 30 of the third embodiment is configured to (1) Invert the on state of each of the first and fourth switches SW1 and SW4 to the off state for the first period during which the first and fourth switches SW1 and SW4 are controlled to be on upon the output current Iac being determined to be in the positive overcurrent state (2) Invert the on state of each of the second and third switches SW2 and SW3 to the off state for the second period during which the second and third switches SW2 and SW3 are controlled to be on upon the output current Iac being determined to be in the negative overcurrent state This configuration of the control apparatus 30 of the third embodiment therefore achieves substantially the same effects as the effects achieved by the control apparatus 30 of the first embodiment.

Fourth Embodiment

Figure 16:
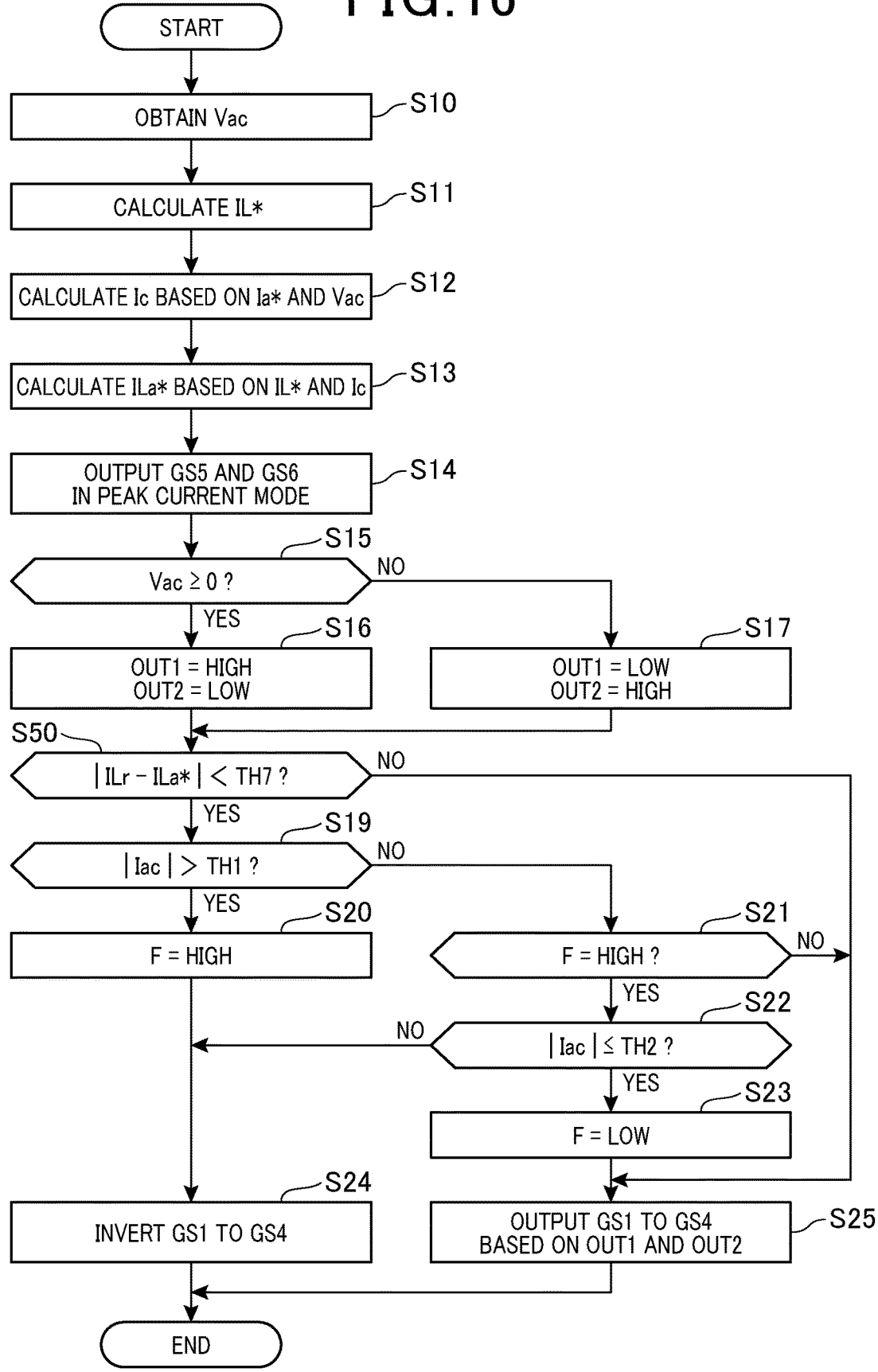
FIG. 16 is a flowchart schematically illustrating a switch control routine carried out by the control apparatus according to the fourth embodiment of the present disclosure.

The following describes the fourth embodiment of the present disclosure with reference to FIG. 16. The structures and/or functions of the power converter system 100 according to the fourth embodiment are different from those of the power converter system 100 according to the first embodiment in the following points. So, the following mainly describes the different points, and omits or simplifies descriptions of like parts between the first and fourth embodiments, to which identical or like reference characters are assigned, thus eliminating redundant description.

In the power converter system 100, if a circuit region through which an overcurrent flows is closer to the first and second DC terminals TD1 and TD2 than to the full-bridge circuit 12, the inductor current ILr becomes larger so that the absolute difference between the inductor current ILr and the corrected command current ILa* becomes a larger value A. In contrast, if an overcurrent flows through the first and second AC terminals TA1 and TA2 as the output current Iac due to a phase deviation between the inductor current ILr and the corrected command current ILa*, the absolute difference between the inductor current ILr and the corrected command current ILa* is smaller than the value A.

From this viewpoint, the control apparatus 30 of the fourth embodiment is configured to invert the on/off state of each of the first to fourth switches SW1 to SW4 on condition that the absolute difference between the inductor current ILr and the corrected command current ILa* is smaller than a predetermined current-difference threshold TH7.

Next, the following describes a switch control routine carried out by the control apparatus 30 according to the fourth embodiment every predetermined control period that corresponds to, for example, the switching cycle Tsw with reference to FIG. 16. Like steps between the switch control routines illustrated in respective FIGS. 11 and 16, to which like step numbers are assigned, are omitted or simplified in description.

After the operation in step S16 or step S17 for setting each of the first and second level signals OUT1 and OUT2 to one of the high level and low level based on the polarity of the AC voltage Vac, the switch control routine proceeds to step S50.

In step S50, the control apparatus 30 determines whether the absolute difference between the inductor current ILr and the corrected command current ILa* is smaller than the predetermined current-difference threshold TH7.

Upon determining that the absolute difference between the inductor current ILr and the corrected command current ILa* is smaller than the predetermined current-difference threshold TH7 (YES in step S50), the control apparatus 30 determines that no overcurrent flows through a circuit region in the power converter system 100 closer to the first and second DC terminals TD1 and TD2 than to the full-bridge circuit 12. Then, the control apparatus 30 executes the determination in step S19 set forth above.

Otherwise, upon determining that the absolute difference between the inductor current ILr and the corrected command current ILa* is equal to or larger than the predetermined current-difference threshold TH7 (NO in step S50), the control apparatus 30 executes the operation in step S25 set forth above.

As described above, the control apparatus 30 of the fourth embodiment is capable of determining whether to invert the on/off state of each of the first to fourth switches SW1 to SW4 upon determining whether the absolute difference between the inductor current ILr and the corrected command current ILa* is smaller than the current-difference threshold TH7.

This configuration of the control apparatus 30 of the fourth embodiment therefore achieves substantially the same effects as the effects achieved by the control apparatus 30 of the first embodiment.

Fifth Embodiment

Figure 17:
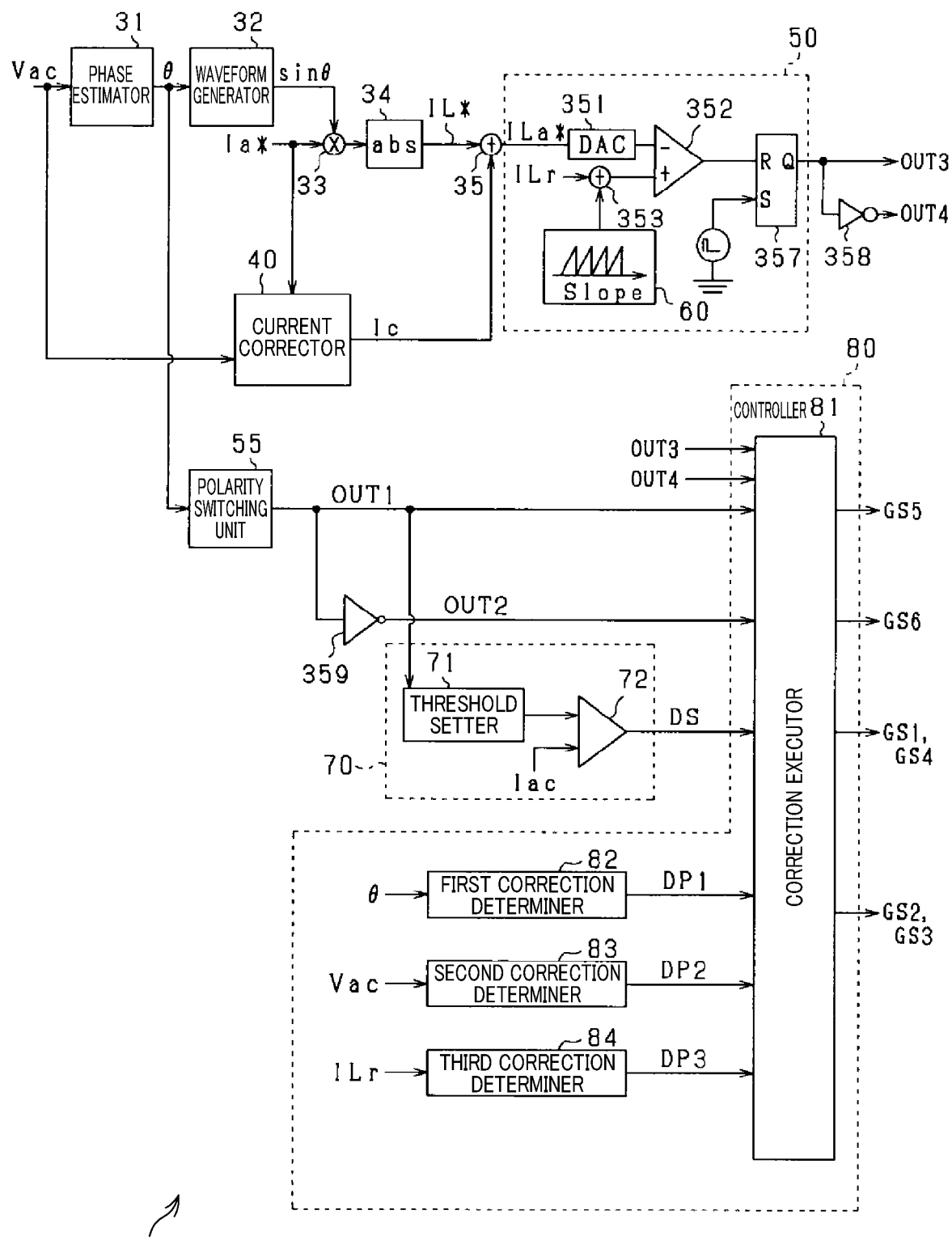
FIG. 17 is a circuitry block diagram schematically illustrating an example of the structure of a control apparatus according to the fifth embodiment of the present disclosure.
Figure 18:
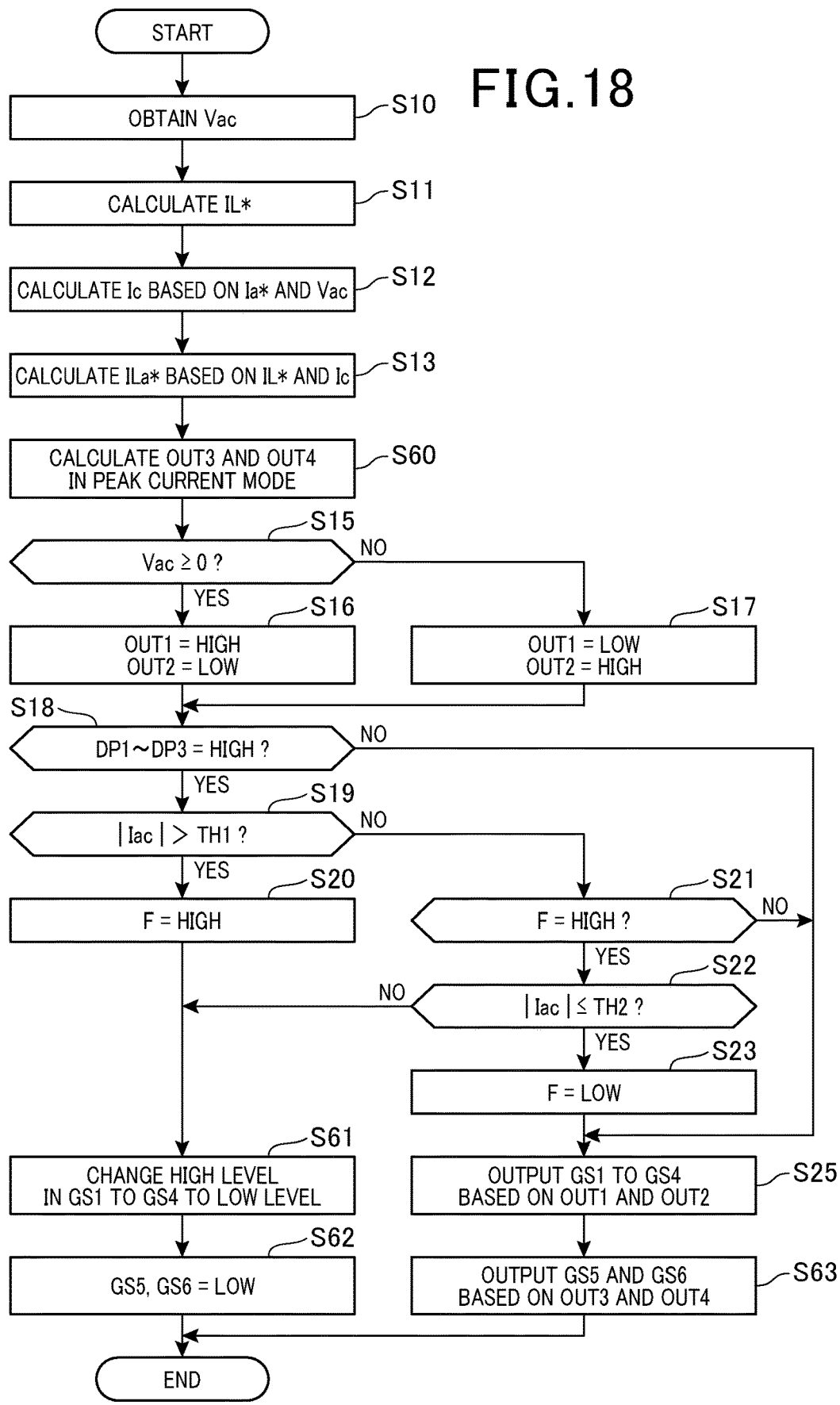
FIG. 18 is a flowchart schematically illustrating a switch control routine carried out by the control apparatus according to the fifth embodiment of the present disclosure.

The following describes the fifth embodiment of the present disclosure with reference to FIGS. 17 and 18. The structures and/or functions of a power converter system 100A according to the fifth embodiment are different from those of the power converter system 100 according to the first embodiment in the following points. So, the following mainly describes the different points, and omits or simplifies descriptions of like parts between the first and fifth embodiments, to which identical or like reference characters are assigned, thus eliminating redundant description.

A control apparatus 30A of the power converter system 100A is configured to turn off or hold off all of the first to fourth switches SW1 to SW4 for a period during which the output current Iac is determined to be in the overcurrent state, thus reducing an overcurrent flowing through the first and second AC terminals TA1 and TA2 as the output current Iac.

Specifically, the control apparatus 30A is configured to change the on state of one of the first pair of the first and fourth switches SW1 and SW4 and the second pair of the second and third switches SW2 and SW3 to the off state for the period during which the output current Iac is determined to be in the overcurrent state.

Referring to FIG. 17, the control apparatus 30A is configured such that the output terminal Q of the flipflop 357 is connected to the correction executor 81, and to the input terminal of the inverter gate 358. The output terminal of the inverter gate 358 is connected to the correction executor 81.

The correction executor 81 is connected to the gates of the respective first to sixth switches SW1 to SW6. That is, the correction executor 81 outputs on-off control signals to the gates of the respective first to sixth switches SW1 to SW6 as the first to sixth gate signals GS1 to GS6. In particular, an output signal outputted from the output terminal Q of the flipflop 357 to the correction executor 81 will be referred to as a third level signal OUT3, and an output signal outputted from the inverter gate 358 to the correction executor 81 will be referred to as a fourth level signal OUT4.

The correction executor 81 is configured to invert the high level of one of the first and second level signals OUT1 and OUT2 to the low level upon the overcurrent determination signal DS having the high level and all the first to third determination signals DS1 to DS3 having the low level.

In this case, when the first level signal OUT1 has the high level, the correction executor 81 is configured to invert the high level of the first level signal OUT1 to the low level, thus changing each of the first and fourth gate signals GS1 and GS4 from the high level to the low level.

Otherwise, when the second level signal OUT2 has the high level, the correction executor 81 is configured to invert the high level of the second level signal OUT2 to the low level, thus changing each of the second and third gate signals GS2 and GS3 from the high level to the low level. This enables all the first to fourth switches SW1 to SW4 to be maintained in the low level for the period during which the output current Iac is determined to be in the overcurrent state.

Additionally, the correction executor 81 is configured to

1. Set the fifth gate signal GS5 to the high level upon the third output signal OUT3 having the high level for a period during which the output current Iac is determined not to be in the overcurrent state
2. Set the fifth gate signal GS5 to the low level upon the third output signal OUT3 having the low level for the period during which the output current Iac is determined not to be in the overcurrent state.

The correction executor 81 is also configured to

1. Set the sixth gate signal GS6 to the high level upon the fourth output signal OUT4 having the high level for the period during which the output current Iac is determined not to be in the overcurrent state
2. Set the sixth gate signal GS6 to the low level upon the fourth output signal OUT4 having the low level for the period during which the output current Iac is determined not to be in the overcurrent state.

The power converter system 100A is configured such that a current flows from the inductor 13 to the intermediate capacitor 14 for the period during which all the first to fourth switches SW1 to SW4 are in the off state, thus charging the intermediate capacitor 14. If the output current Iac is determined not to be in the overcurrent state, turning on of one of the first pair of the first and fourth switches SW1 and SW4 and the second pair of the second and third switches SW2 and SW3 may cause charge stored in the intermediate capacitor 14 to output an inrush current to flow into one of the first pair of the first and fourth switches SW1 and SW4 and the second pair of the second and third switches SW2 and SW3 being in the on state.

For addressing such an issue, the correction executor 81 is configured to maintain each of the fifth and sixth gate signals GS5 and GS6 in the low level independently of the state of each of the third and fourth level signals OUT3 and OUT4 for the period during which the output current Iac is determined to be in the overcurrent state. This configuration prevents a current from flowing from the first DC terminal TD1 to the intermediate capacitor 14 via the fifth switch SW5. This curbs an increase in the inductor current ILr, thus preventing an inrush current from flowing from the intermediate capacitor 14 into one of the first pair of the first and fourth switches SW1 and SW4 and the second pair of the second and third switches SW2 and SW3 being in the on state, i.e. which are in the on state, at a timing when the overcurrent state of the output current Iac has recovered to the normal state.

Next, the following describes a switch control routine carried out by the control apparatus 30 according to the fifth embodiment every predetermined control period that corresponds to, for example, the switching cycle Tsw with reference to FIG. 18. Like steps between the switch control routines illustrated in respective FIGS. 11 and 18, to which like step numbers are assigned, are omitted or simplified in description.

After the operation in step S13 for calculating the command current Ia*, the control apparatus 30A generates and outputs the third and fourth level signals OUT3 and OUT4 for the respective fifth and sixth switches SW5 and SW6 in the peak current mode in step S60 in the same manner as the operation in step S14.

Thereafter, upon determining that all the first to third determination signals DS1 to DS3 have the high level, the control apparatus 30A determines whether the absolute value of the output current Iac is larger than the overcurrent threshold TH1 in step S19.

Upon determining that the absolute value of the output current Iac is larger than the overcurrent threshold TH1 (YES in step S19), the control apparatus 30A sets or holds the overcurrent determination flag F to a logical high level, i.e. 1 in step S20, and executes the operation in step S61.

Specifically, the control apparatus 30A inverts the high level of one of the first and second level signals OUT1 and OUT2 to the low level in step S61. This enables all the first to fourth gate signals GS1 to GS4 to be in the low level, resulting in all the first to fourth switches SW1 to SW4 being in the off state.

Next, the control apparatus 30A inverts the high level of one of the third and fourth level signals OUT3 and OUT4 to the low level in step S62. This enables the fifth and sixth switches SW5 and SW6 to be in the off state, preventing a current from flowing from the inductor 13 into the intermediate capacitor 14.

Otherwise, upon determining that the absolute value of the output current Iac is equal to or smaller than the overcurrent threshold TH1 (NO in step S19) and the determination in step S21 is negative (NO in step S21), the control apparatus 30A executes the operation in step S25, and thereafter, executes the operation in step S63.

Specifically, the control apparatus 30A outputs, based on the respective logical levels of the third and fourth level signals OUT3 and OUT4, the fifth and sixth gate signals GS5 and GS6 to the gates of the respective fifth and sixth switches SW5 and SW6 in step S63, and thereafter, terminates the present cycle of the switch control routine, and thereafter performs the next cycle of the switch control routine.

As described above, the control apparatus 30A of the fifth embodiment is configured to change the on state of one of the first pair of the first and fourth switches SW1 and SW4 and the second pair of the second and third switches SW2 and SW3 to the off state for the period during which the output current Iac is determined to be in the overcurrent state. This configuration turns off or holds off all the first to fourth switches SW1 to SW4 of the full-bridge circuit 12 for the period during which the output current Iac is determined to be in the overcurrent state, enhancing an effect of reducing the flow of an overcurrent through the first and second AC terminals TA1 and TA2 as the output current Iac.

The control apparatus 30A is also configured to maintain the fifth and sixth switches SW5 and SW6 in the off state upon output current Iac being determined to be in the overcurrent state. This configuration prevents an inrush current from flowing into the full-bridge circuit 12 due to charge stored in the intermediate capacitor 14. The other effects achieved by the control apparatus 30A of the fifth embodiment are substantially identical to the effects achieved by the control apparatus 30 of the first embodiment, and therefore, descriptions of which are omitted.

Sixth Embodiment

Figure 19:
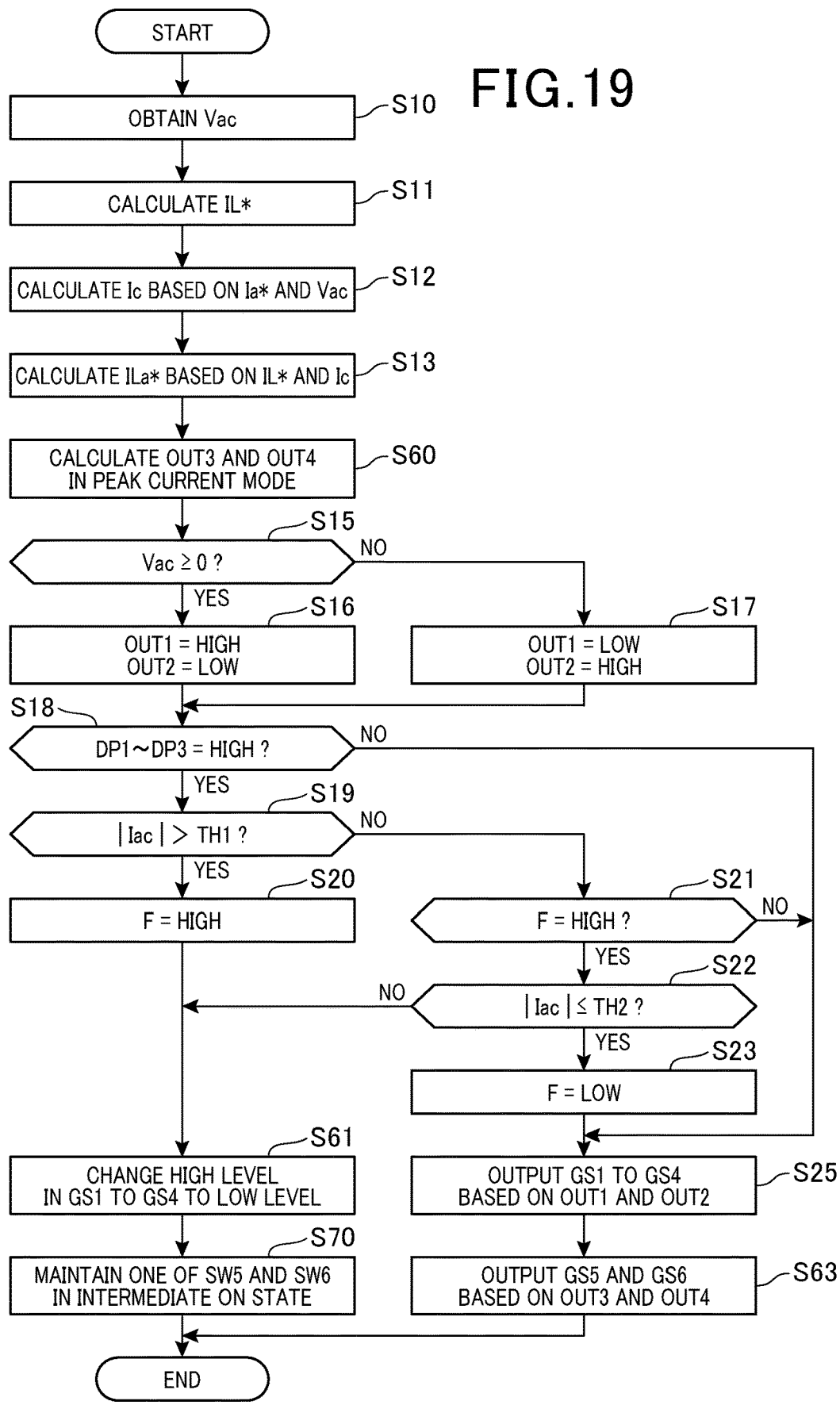
FIG. 19 is a flowchart schematically illustrating a switch control routine carried out by the control apparatus according to the sixth embodiment of the present disclosure.

The following describes the sixth embodiment of the present disclosure with reference to FIG. 19. The structures and/or functions of a power converter system 100 according to the sixth embodiment are different from those of the power converter system 100A according to the fifth embodiment in the following points. So, the following mainly describes the different points, and omits or simplifies descriptions of like parts between the fifth and sixth embodiments, to which identical or like reference characters are assigned, thus eliminating redundant description.

The correction executor 81 of the sixth embodiment is configured to hold the fifth switch SW5 to be in an intermediate-on state to thereby prevent a current from flowing from the inductor 13 into the intermediate capacitor 14. Note that the intermediate-on state of the fifth switch SW5 represents that the fifth switch SW5 is in the on state and the on resistance of the fifth switch SW5 in the intermediate on state is higher than the on resistance of the fifth switch SW5 in the full-on state.

Next, the following describes a switch control routine carried out by the control apparatus 30A according to the sixth embodiment every predetermined control period that corresponds to, for example, the switching cycle Tsw with reference to FIG. 19. Like steps between the switch control routines illustrated in respective FIGS. 11 and 19, to which like step numbers are assigned, are omitted or simplified in description.

After completion of the operation in step S61, the control apparatus 30A maintains one of the fifth and sixth switches SW5 and SW6, which should be turned on, to be in the intermediate on state in step S70. Specifically, the control apparatus 30A reduces the high voltage level of the fifth gate signal GS5 required to turn on the fifth switch SW5 in the full-on state down to a voltage level required to turn on the fifth switch SW5 in the intermediate-on state in step S70.

This configuration of the control apparatus 30A of the sixth embodiment therefore achieves substantially the same effects as the effects achieved by the control apparatus 30A of the fifth embodiment.

Modification of the Sixth Embodiment

The correction executor 81 of the sixth embodiment can be configured to change the full-on state of one of the first pair of the first and fourth switches SW1 and SW4 and the second pair of the second and third switches SW2 and SW3 to the intermediate-on state upon the output current Iac being determined to be in the overcurrent state, thus increasing the on resistance of one of the first pair of the first and fourth switches SW1 and SW4 and the second pair of the second and third switches SW2 and SW3. This configuration reduces the flow of the output current Iac from the full-bridge circuit 12 to the first and second AC terminals TA1 and TA2.

In this modification, the control apparatus 30A reduces the high voltage level of each of the first and fourth switches SW1 and SW4 to the voltage level required to turn on the corresponding one of the first and fourth switches SW1 and SW4 to be in the intermediate-on state upon the first level signal OUT1 being in the high level in step S61. On the other hand, the control apparatus 30A reduces the high voltage level of each of the second and third switches SW2 and SW3 to the voltage level required to turn on the corresponding one of the second and third switches SW2 and SW3 to be in the intermediate-on state upon the second level signal OUT2 being in the high level in step S61.

This configuration of the control apparatus 30A according to this modification achieves substantially the same effects as the effects achieved by the control apparatus 30A of the sixth embodiment.

Other Modifications

The controller 80 of each of the first to sixth embodiments can be configured to provide any one of the first to third correction determiners 82 to 84. In this modification, the control apparatus 100, 100A is configured to determine whether any one of the first to third determination signals DS1 to DS3 have the high level.

The controller 80 of each of the first to sixth embodiments can be configured to provide none of the first to third correction determiners 82 to 84. In this modification, the operation in step S18 is eliminated from the flowchart in each of FIGS. 11, 14, 16, 18, and 19, and the operation in step S40 is eliminated from the flowchart in FIG. 15.

Each of the first to sixth embodiments can use IGBTs as the respective first to fourth switches SW1 to SW4 in place of MOSFETs. In this modification, each of the first to fourth switches SW1 to SW4 is comprised of a corresponding one of flyback diodes D1 to D4 connected in antiparallel thereto.

The power conversion system 100, 100A according to each embodiment can be designed as a two-way converter configured to convert (1) A first function of converting first AC power inputted from the first and second AC terminals TA1 and TA2 into first DC power and outputting the DC power from the first and second DC terminals TD1 and TD2

(2) A second function of converting second DC power inputted from the first and second DC terminals TD1 and TD2 into second AC power and outputting the second AC power from the first and second AC terminals TA1 and TA2

When the power converter system 100, 100A converts AC power based on the AC voltage Vac into DC power based on the DC voltage Vdc, the sixth switch SW6 serves as a drive switch.

The control apparatus 30, 30A is configured to output, to the gate of the fifth switch SW5, the fifth gate signal GS5 in the peak current mode, but can be configured to output, to the gate of the fifth switch SW5, the fifth gate signal GS5 in a known average current mode.

The control apparatuses and their methods described in the present disclosure can be implemented by at least one processor, each of which is (1) Comprised of one or more programmed logic circuits each programmed to execute one or more particular functions embodied in computer programs (2) Comprised of one or more hardware logic circuits, or (3) Comprised of one or more programmed logic circuits and one or more hardware logic circuits While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A control apparatus applicable to a power converter system that includes an inductor, a drive switch, first and second alternating-current terminals, first and second direct-current terminals, and a full-bridge circuit provided between the inductor and the first and second alternating-current terminals, the full-bridge circuit being comprised of first to fourth switches and first to fourth diodes connected in antiparallel to the respective first to fourth switches, the first and second switches being connected in series to each other, the third and fourth switches being connected in series to each other, a connection point between the first and second switches being connected to the first alternating-current terminal, a connection point between the third and fourth switches being connected to the second alternating-current terminal, the power converter system having at least one of
a first function of converting first alternating-current power inputted from the first and second alternating-current terminals based on an alternating-current power source into first direct-current power and outputting the first direct-current power from the first and second direct-current terminals; and
a second function of converting second direct-current power inputted from the first and second direct-current terminals into second alternating-current power and outputting the second alternating-current power from the first and second alternating-current terminals,
the control apparatus comprising:
a voltage obtainer configured to obtain an alternating-current voltage having a polarity across the first and second alternating-current terminals;
an overcurrent deter miner configured to determine whether a target current flowing through the first and second alternating-current terminals is in an overcurrent state; and
a controller configured to:
alternately turn on a first set of the first and fourth switches and a second set of the second and third switches in accordance with the polarity of the alternating-current voltage; and
change a switching operation of at least one of the first to fourth switch being in an on state to thereby reduce the target current flowing through the first and second alternating-current terminals upon determination that the target current flowing through the first and second alternating-current terminals is in the overcurrent state.

2. The control apparatus according to claim 1, wherein, upon determination that the target current flowing through the first and second alternating-current terminals is in the overcurrent state, the controller is configured to:
change the on state of one of the first set of the first and fourth switches and the second set of the second and third switches to an off state; and
change the off state of the other of the first set of the first and fourth switches and the second set of the second and third switches to the on state upon determination that the target current flowing through the first and second alternating-current terminals is in the overcurrent state.

3. The control apparatus according to claim 1, wherein: the controller is configured to:
change the on state of one of the first set of the first and fourth switches and the second set of the second and third switches to an off state while holding the off state of the other of the first set of the first and fourth switches and the second set of the second and third switches upon determination that the target current flowing through the first and second alternating-current terminals is in the overcurrent state.

4. The control apparatus according to claim 1, wherein: the controller is configured to:
alternately apply a control voltage to one of the first set of the first and fourth switches and the second set of the second and third switches to alternately turn on the first set of the first and fourth switches and the second set of the second and third switches in accordance with the polarity of the alternating-current voltage; and
reduce a value of the control voltage applied to one of the first set of the first and fourth switches and the second set of the second and third switches to thereby increase an on resistance of one of the first set of the first and fourth switches and the second set of the second and third switches while holding the on state of one of the first set of the first and fourth switches and the second set of the second and third switches upon determination that the target current flowing through the first and second alternating-current terminals is in the overcurrent state.

5. The control apparatus according to claim 3, wherein: the controller is configured to:
apply a drive control voltage to the drive switch to turn on the drive switch; and
perform, upon determination that the target current flowing through the first and second alternating-current terminals is in the overcurrent state, one of:
holding the drive switch in the off state; and
reduce a value of the drive control voltage applied to the drive switch to thereby increase an on resistance of the drive switch while holding the on state of the drive switch upon determination that the target current flowing through the first and second alternating-current terminals is in the overcurrent state.

6. The control apparatus according to claim 1, wherein: the overcurrent determiner is configured to:
determine whether an absolute value of the target current flowing through the first and second alternating-current terminals is larger than a predetermined overcurrent threshold;
determine that the target current flowing through the first and second alternating-current terminals is in the overcurrent state upon determining that the absolute value of the target current flowing through the first and second alternating-current terminals is larger than the predetermined overcurrent threshold;
determine whether the absolute value of the target current flowing through the first and second alternating-current terminals, which has been determined to be larger than the predetermined overcurrent threshold, is smaller than a predetermined recovery threshold; and
determine that the target current flowing through the first and second alternating-current terminals is not in the overcurrent state upon determining that the absolute value of the target current flowing through the first and second alternating-current terminals, which has been determined to be larger than the predetermined overcurrent threshold, is smaller than the predetermined recovery threshold.

7. The control apparatus according to claim 1, further comprising:
a current obtaining unit configured to obtain a value of an inductor current flowing through the inductor; and
a current controller configured to control on-off switching operations of the drive switch to thereby adjust the value of the inductor current to a command current that is generated based on the alternating-current voltage,
wherein the overcurrent determiner is configured to:
calculate an absolute current difference between the command current and the target current flowing through the first and second alternating-current terminals;

determine whether the absolute current difference is larger than a predetermined current-deviation threshold; and determine that the target current flowing through the first and second alternating-current terminals is in the overcurrent state upon determining that the absolute current difference is larger than the predetermined current-deviation threshold.

8. The control apparatus according to claim 7, wherein: the overcurrent determiner is configured to:

determine whether the absolute current difference, which has been determined to be larger than the predetermined current-deviation threshold, is smaller than a predetermined current recovery threshold; and determine that the target current flowing through the first and second alternating-current terminals is not in the overcurrent state upon determining that the absolute current difference, which has been determined to be larger than the predetermined current-deviation threshold, is smaller than the predetermined current recovery threshold.

9. The control apparatus according to claim 7, wherein: the controller is configured to:

determine whether the absolute current difference is smaller than a predetermined current difference threshold upon the target current being determined to be in the overcurrent state; and change the switching operation of at least one of the first to fourth switch being in the on state on condition that the absolute current difference is determined to be smaller than the predetermined current difference threshold.

10. The control apparatus according to claim 1, wherein: the controller is configured to:

determine whether a phase of the alternating-current voltage is within a period including one of zero-crossing points of the alternating-current voltage upon the target current being determined to be in the overcurrent state; and change the switching operation of at least one of the first to fourth switch being in the on state on condition that the phase of the alternating-current voltage is within the period including one of zero-crossing points of the alternating-current voltage.

11. The control apparatus according to claim 1, wherein: the controller is configured to:

determine whether the absolute value of the alternating-current voltage is smaller than a predetermined voltage threshold upon the target current being determined to be in the overcurrent state; and change the switching operation of at least one of the first to fourth switch being in the on state on condition that the absolute value of the alternating-current voltage is smaller than the predetermined voltage threshold.

12. The control apparatus according to claim 1, wherein: the controller is configured to:

determine whether an absolute value of an inductor current flowing through the inductor is smaller than a predetermined inductor-current threshold upon the target current being determined to be in the overcurrent state; and change the switching operation of at least one of the first to fourth switch being in the on state with a condition that the absolute value of the inductor current flowing through the inductor is deter mined to be smaller than the predetermined inductor-current threshold.

13. The control apparatus according to claim 1, wherein: the controller is configured to:

turn on the first set of the first and fourth switches and turn off the second set of the second and third switches upon the polarity of the alternating-current voltage being positive; and turn on the second set of the second and third switches and turn off the first set of the first and fourth switches upon the polarity of the alternating-current voltage being negative; and the overcurrent determiner is configured to determine whether the target current flowing through the first and second alternating-current terminals is in a positive overcurrent state or a negative overcurrent state as the overcurrent state, the positive overcurrent state representing that the overcurrent flows from the first alternating-current terminal to the second alternating-current terminal through the AC power source, the negative overcurrent state representing that the overcurrent flows from the second alternating-current terminal to the first alternating-current terminal through the AC power source, the controller being configured to:

change, upon the target current being determined to be in the positive overcurrent state, the switching operation of at least one of the first to fourth switch being in the on state for a first period during which the first and fourth are controlled to be on; and change, upon the target current being determined to be in the negative overcurrent state, the switching operation of at least one of the first to fourth switch being in the on state for a second period during which the second and third switches are controlled to be on.

* * * * *